US012563699B2

(12) United States Patent
Yang et al.

(10) Patent No.: US 12,563,699 B2
(45) Date of Patent: Feb. 24, 2026

(54) HEAT DISSIPATION CABINET AND COMMUNICATIONS DEVICE

(71) Applicant: HUAWEI TECHNOLOGIES CO., LTD., Shenzhen (CN)

(72) Inventors: Zhiwen Yang, Dongguan (CN); Tao Yan, Dongguan (CN); Jie Chen, Dongguan (CN); Henglong Zou, Shenzhen (CN); Qingying Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 225 days.

(21) Appl. No.: 18/159,709

(22) Filed: Jan. 26, 2023

(65) Prior Publication Data

US 2023/0225081 A1     Jul. 13, 2023

Related U.S. Application Data

(63) Continuation of application No. PCT/CN2021/107445, filed on Jul. 20, 2021.

(30) Foreign Application Priority Data

Jul. 28, 2020    (CN) .......................... 202010749348.6

(51) Int. Cl.
H05K 7/20                (2006.01)
(52) U.S. Cl.
CPC ..... *H05K 7/20309* (2013.01); *H05K 7/20154* (2013.01); *H05K 7/20318* (2013.01); *H05K 7/20336* (2013.01); *H05K 7/20409* (2013.01)
(58) Field of Classification Search
CPC ........... H05K 7/20309; H05K 7/20154; H05K 7/20318; H05K 7/20336; H05K 7/20409;
(Continued)

(56) References Cited

U.S. PATENT DOCUMENTS

| | | | |
|---|---|---|---|
| 4,793,405 | A | 12/1988 | Diggelmann et al. |
| 2001/0006101 | A1 | 7/2001 | Chu et al. |

(Continued)

FOREIGN PATENT DOCUMENTS

| | | |
|---|---|---|
| CN | 103687384 A | 3/2014 |
| CN | 103687446 A | 3/2014 |

(Continued)

OTHER PUBLICATIONS

Extended European Search Report dated Nov. 29, 2023, issued for European Application No. 21850083.3 (8 pages).

(Continued)

*Primary Examiner* — Jacob R Crum

(57)                ABSTRACT

A heat dissipation cabinet includes a cabinet body and a heat dissipation apparatus. A first accommodation region of the cabinet body can accommodate a plugboard in a stacked manner, and heat source components of the plugboard dissipate heat through the heat dissipation apparatus. An evaporator, a condenser, and an evaporation pipeline of the heat dissipation apparatus are connected to a liquid return pipeline to form a heat exchange loop, and the evaporator is in thermal contact with an outer surface of a heat source component. The condenser is disposed in a second accommodation region and located above the evaporator. A refrigerant flows in the heat exchange loop, to draw heat of the heat source component far to the condenser, and take away heat of the condenser using air generated by a fan. A second accommodation region is used as an independent air duct whose path is relatively short.

16 Claims, 15 Drawing Sheets

(58) Field of Classification Search
CPC .......... H05K 7/20681; H05K 7/20818; H05K
7/20327
See application file for complete search history.

(56) References Cited

U.S. PATENT DOCUMENTS

| | | | |
|---|---|---|---|
| 2012/0285003 A1 | 11/2012 | Ekstedt et al. | |
| 2016/0120019 A1* | 4/2016 | Shedd ..................... | F25B 41/40 |
| | | | 361/679.47 |
| 2016/0330873 A1 | 11/2016 | Farshchian et al. | |
| 2016/0353606 A1* | 12/2016 | Ryoo ................. | H05K 7/20145 |
| 2017/0245398 A1* | 8/2017 | Hayashi ............. | H05K 7/20809 |
| 2017/0303441 A1 | 10/2017 | Farshchian et al. | |
| 2018/0160571 A1* | 6/2018 | Baker ..................... | H02S 40/42 |

FOREIGN PATENT DOCUMENTS

| | | | |
|---|---|---|---|
| CN | 104571382 A | 4/2015 | |
| CN | 106793705 A | 5/2017 | |
| CN | 107635382 A | 1/2018 | |
| CN | 213126882 U | 5/2021 | |
| WO | 2015114742 A1 | 8/2015 | |

OTHER PUBLICATIONS

International Search Report dated Oct. 19, 2021, issued for International Application No. PCT/CN2021/107445 (10 pages).

* cited by examiner

HEAT DISSIPATION CABINET AND COMMUNICATIONS DEVICE

CROSS-REFERENCE TO RELATED APPLICATIONS

This application is a continuation of International Application No. PCT/CN2021/107445, filed on Jul. 20, 2021, which claims priority to Chinese Patent Application No. 202010749348.6, filed on Jul. 28, 2020. The disclosures of the aforementioned applications are hereby incorporated by reference in their entireties.

TECHNICAL FIELD

Embodiments of this disclosure relate to the field of heat dissipation technologies, and in particular, to a heat dissipation cabinet and a communications device.

BACKGROUND

With development of a large capacity and high density of a communications device, a capacity of a chip becomes larger, and a plurality of cores are stacked in the chip. As a result, power consumption of a system is increasingly large. The communications device has an increasingly high heat dissipation requirement, and improvement space of a heat dissipation capability determines a capacity and long-term evolution competitiveness of the communications device. As shown in FIG. 1a and FIG. 1b, an existing communications device includes a cabinet body 1 and a plugboard 2 that has a chip 2a. The chip 2a is used as a heat source component and is disposed with a heat sink 3. Heat generated during working of the chip 2a is transferred to the heat sink 3. The plugboard 2 that has the chip 2a and the heat sink 3 are located in slot space. The slot space is used as an air duct. An extension direction of the air duct is from a front panel to a rear panel of the cabinet body 1. A fan 4 in the slot space generates an air flow to take heat of the heat sink 3 out of the device. An arrow indicates the air flow generated by the fan 4.

The panel of the cabinet body 1 needs to be shielded, the air duct is relatively long, components in the slot space are dense, and there is little free internal space. As a result, resistance of a system is large, efficiency of the fan 4 is relatively low, an air amount of the system is relatively small, and a heat dissipation effect is relatively poor. As shown in FIG. 2, an air flow indicated by the arrow enters the slot space, and passes through the chip 2a to take heat out of the slot space. A low air speed region is easily formed at a corner 1a between the front panel and a side panel of the cabinet body, and a heat dissipation effect in the low air speed region is relatively poor. As shown in FIG. 3, the chip 2a on the plugboard 2 and the heat sink 3 of the chip 2a are disposed in the slot space. Space occupied by the heat sink 3 is constrained by slot spacing, a pitch, a height of the chip, and a layout of the plugboard. The heat sink 3 has a relatively small available heat dissipation area, a utilization rate of the slot space is relatively low. This causes a relatively poor heat dissipation effect.

SUMMARY

Embodiments of this disclosure provide a heat dissipation cabinet and a communications device, to resolve a problem of a relatively poor heat dissipation effect caused when a heat source component in an existing communications device uses a heat sink and a fan to dissipate heat, air resistance of a system is relatively large and a low air speed region occurs, and a heat dissipation area of the heat sink is constrained by slot space.

To achieve resolution of these problems, the following technical solutions are used in example embodiments of this disclosure.

According to a first aspect, an embodiment of this disclosure provides a heat dissipation cabinet, including a cabinet body and at least one heat dissipation apparatus. The cabinet body has a first accommodation region and a second accommodation region. The first accommodation region can accommodate, through stacking, plugboards with heat source components. Each heat dissipation apparatus includes at least one evaporator, at least one condenser, an evaporation pipeline, a liquid return pipeline, and a fan. Each evaporator is configured to be in thermal contact with an outer surface of one or more heat source components. Each condenser is disposed in the second accommodation region and is located above the evaporator. In each heat dissipation apparatus, the evaporator is connected to the condenser by using the evaporation pipeline and the liquid return pipeline to form a heat exchange loop. The heat exchange loop is filled with refrigerating working substances. The fan is configured to dissipate heat of the condenser through air cooling.

In the heat dissipation cabinet provided in this embodiment of this disclosure, the first accommodation region of the cabinet body can accommodate the plugboards through stacking, and heat of the heat source components of the plugboards is dissipated by using the heat dissipation apparatus. The evaporator, the condenser, the evaporation pipeline, and the liquid return pipeline in the heat dissipation apparatus are connected to form the heat exchange loop. The evaporator is in thermal contact with the outer surface of the heat source component. The condenser is disposed in the second accommodation region of the cabinet body and is located above the evaporator. Heat generated during working of the heat source component is transferred to refrigerating working substance in the evaporator. The refrigerating working substance in the evaporator changes from a liquid state to a gas state after absorbing the heat. The refrigerating working substance in the gas state rises into the condenser along the evaporation pipeline. The refrigerating working substance in the condenser releases heat and changes into the refrigerating working substance in the liquid state, and then the refrigerating working substance in the liquid state returns to the evaporator through the liquid return pipeline under gravity. In this way, the refrigerating working substance circularly flows in the heat exchange loop, to draw the heat of the heat source component far to the condenser, and rapidly take away the heat of the condenser by using air generated by the fan, thereby implementing centralized heat dissipation.

Compared with a conventional air-cooling heat dissipation solution, in the solution in this embodiment, the second accommodation region is used as an independent air duct, a path of the air duct is relatively short, and the fan blows air to the condenser in the second accommodation region. This may improve an air amount, reduce resistance of a system, and improve a convective heat exchange coefficient, thereby improving a convective heat exchange and heat dissipation capability, and overcoming a case in the conventional heat dissipation solution in which a low air speed region exists, causing a poor heat dissipation effect. In addition, the condenser is removed out of the plugboard, so that a volume of the condenser can be increased, to enlarge a heat dissipation area of convective heat exchange and reduce air resistance of the system, improve the convective heat exchange and heat dissipation capability, and overcome a case in the conventional heat dissipation solution in which a heat dissipation area of a heat sink is constrained by slot space. The condenser is used as a heat dissipation resource pool. Heat of heat source components with different heat dissipation requirements is drawn far to the heat dissipation resource pool through the heat exchange loop, to implement rapid heat dissipation for a system with uneven heat, thereby overcoming a case in the conventional heat dissipation solution in which a heat dissipation effect is not good because air amounts in a slot are uneven. Compared with the conventional heat dissipation solution, this solution uses the heat dissipation cabinet in this embodiment of this disclosure, to reduce air resistance during heat dissipation, enlarge a heat dissipation area, and improve comprehensive heat dissipation performance. Because the condenser is removed out of the plugboard, in space of a same size in the cabinet body, the first accommodation region can accommodate more plugboards through stacking, to increase a device capacity.

Compared with an existing heat dissipation solution in which the heat source component is immersed in a sealed housing and filled with working substances, in the heat dissipation apparatus in this embodiment of this disclosure, the evaporator is in thermal contact with the outer surface of the heat source component, so that a relatively small evaporator can be made, provided that effective heat exchange can be implemented between the evaporator and the heat source component. In this way, mass of the refrigerating working substance filled in the heat exchange loop is relatively small, and use costs are relatively low. The evaporator is easy to bond to and assemble with the outer surface of the heat source component, which can further effectively overcome a case in which the heat source component is immersed in the working substance to cause chemical erosion of the component, thereby improving working reliability of the heat source component.

With reference to the first aspect, in a first possible implementation of the first aspect, the second accommodation region is located on an upper section of the cabinet body. The cabinet body has an air inlet and an air outlet that communicate with the second accommodation region. For example, the air inlet is disposed on a front panel of the cabinet body, and the air outlet is disposed on a rear panel of the cabinet body. In this way, when the fan is disposed in the second accommodation region, an air flow generated by the fan enters the second accommodation region through the air inlet on a front side of the cabinet body, to blow out, through the air outlet on a rear side of the cabinet body, air obtaining heat of the condenser. In addition, the second accommodation region may be disposed at a proper position in the cabinet body based on a space requirement of a system, for example, may be disposed at a position of a rear section close to a top section of the cabinet body.

With reference to the first aspect or the first possible implementation of the first aspect, in a second possible implementation of the first aspect, the fan is disposed in the second accommodation region of the cabinet body. The fan can be independently maintained or replaced. When a plurality of fans are disposed, the plurality of fans may be disposed in parallel. In this way, a structure is compact, so that all air generated by the fan is provided to the condenser to improve heat dissipation efficiency.

With reference to any one of the first aspect to the second possible implementation of the first aspect, in a third possible implementation of the first aspect, in a same heat dissipation apparatus, each evaporator has a first inlet end and a first outlet end, each condenser has a second inlet end and a second outlet end, two ends of the evaporation pipeline are respectively connected to the first outlet end and the second inlet end, and two ends of the liquid return pipeline are respectively connected to the second outlet end and the first inlet end. The heat exchange loop is easy to assemble. The evaporator is in thermal contact with the outer surface of the heat source component, and the condenser is located above the evaporator. In this way, the refrigerating working substance can circularly flow in the heat exchange loop to continuously draw heat of the heat source component far to the condenser, and perform air cooling in combination with the fan, to implement heat dissipation for the heat source component.

With reference to the third possible implementation of the first aspect, in a fourth possible implementation of the first aspect, when a single heat source component is arranged along a vertical plane, correspondingly, the evaporator is also arranged along the vertical plane, and the first inlet end is located below the first outlet end. In this way, after the refrigerating working substance in the liquid state in the evaporator absorbs heat and changes into the gas state, the refrigerating working substance in the gas state may be exhausted through the first outlet end located on an upper section of the evaporator, and is transmitted to the condenser through the evaporation pipeline. The refrigerating working substance in the gas state releases heat in the condenser and changes into the liquid state. The refrigerating working substance in the liquid state flows to the first inlet end located on a lower section of the evaporator and enters the evaporator under gravity. When the heat source component is horizontally arranged, the evaporator is also horizontally arranged. In combination with the condenser and the pipeline, the heat of the heat source component can also be transferred to the condenser for heat dissipation.

With reference to the third possible implementation or the fourth possible implementation of the first aspect, in a fifth possible implementation of the first aspect, the second inlet end of the condenser is detachably connected to the evaporation pipeline by using a first fast switching connector, and the second outlet end of the condenser is detachably connected to the liquid return pipeline by using a second fast switching connector. The fast switching connector is used to facilitate assembly and detachment between the condenser and each of the evaporation pipeline and the liquid return pipeline, to separately maintain or replace the condenser or the plugboard with the evaporator. Compared with a heat dissipation solution in which the heat exchange loop is disposed on the plugboard, in this embodiment, the condenser may be detached from the plugboard with the evaporator, and may be installed outside the plugboard to be independent of the plugboard. A volume of the condenser is not limited, and a heat dissipation area may be enlarged. In addition, because space of the condenser is independent, an air flow passing through the condenser is not hindered by another part in the plugboard. This greatly reduces resistance, and improves an air amount of the system, thereby facilitating improvement of a convective heat exchange and heat dissipation capability.

With reference to the fifth possible implementation of the first aspect, in a sixth possible implementation of the first aspect, a switch valve is disposed on at least the liquid return pipeline; or the switch valve is disposed on both the liquid return pipeline and the evaporation pipeline. When the plugboard is unplugged in a power-on state or a power-off state, the working substances in the liquid return pipeline and the evaporation pipeline are basically consistent.

With reference to the sixth possible implementation of the first aspect, in a seventh possible implementation of the first aspect, the switch valve is an electromagnetic control valve, and the heat dissipation cabinet further includes a control unit, where the control unit is configured to control on and off of the electromagnetic control valve. The control unit is used to automatically control the electromagnetic control valve.

With reference to the seventh possible implementation of the first aspect, in an eighth possible implementation of the first aspect, the control unit is a control circuit disposed on the plugboard. When the plugboard is electrically connected to a back panel of the heat dissipation cabinet, the control circuit controls the electromagnetic control valve to be turned on. When the plugboard is connected to the back panel, the electromagnetic control valve may be controlled to be turned on.

With reference to the seventh possible implementation of the first aspect, in a ninth possible implementation of the first aspect, the heat dissipation cabinet further includes a sensor configured to detect a temperature of the heat source component on the plugboard. The control unit controls the electromagnetic control valve to be turned on when the temperature detected by the sensor exceeds a specified value. The electromagnetic control valve is controlled to be turned on or off based on the temperature. The electromagnetic control valve may be a normally off control valve, so that when the plugboard is removed, carried working substance can be reduced.

With reference to any one of the fifth possible implementation to the ninth possible implementation of the first aspect, in a tenth possible implementation of the first aspect, a section that is of the pipeline and that is configured to connect to the fast switching connector is disposed as a flexible pipe. The flexible pipe facilitates adjustment of a position of the fast switching connector, to implement fast connection and assembly of the fast switching connector. For example, a section that is of the evaporation pipeline and that is configured to connect to the first fast switching connector is a flexible pipe, or the evaporation pipeline is a flexible pipe. The first fast switching connector can be quickly assembled and detached in both two manners. Similarly, a section that is of the liquid return pipeline and that is configured to connect to the second fast switching connector is a flexible pipe, or the liquid return pipeline is a flexible pipe. The second fast switching connector can be quickly assembled and detached in both two manners.

With reference to any one of the third possible implementation to the tenth possible implementation of the first aspect, in an eleventh possible implementation of the first aspect, each condenser includes a plurality of heat exchange pipes and a plurality of heat dissipation fins. Several heat exchange pipes are disposed in parallel at intervals. A first end of each heat exchange pipe communicates with the second inlet end, and a second end of each heat exchange pipe communicates with the second outlet end. The heat dissipation fins are connected to the heat exchange pipes. The plurality of heat exchange pipes are disposed in parallel, and the heat dissipation fins are disposed on the heat exchange pipes. In this way, a contact area between the heat exchange pipes and the heat dissipation fins can be enlarged, and the heat dissipation fins can enlarge a heat dissipation area. When passing through the heat exchange pipe, the refrigerating working substance in the gas state from the evaporator releases heat and is converted from the gas state to the liquid state. Heat of the refrigerating working substance in the heat exchange pipe is transferred to the heat dissipation fin through a side wall of the heat exchange pipe, and then diffused into an external environment, to implement rapid heat dissipation. In a same condenser, the second inlet end is located above the second outlet end, so that the refrigerating working substance in the gas state from the evaporator rises through the evaporation pipeline to be transferred to the second inlet end, then enters the condenser and releases heat to change from the gas state to the liquid state, and is further output through the second outlet end under gravity. This reduces internal resistance of the pipeline, and helps improve a heat dissipation effect.

With reference to the eleventh possible implementation of the first aspect, in a twelfth possible implementation of the first aspect, first ends of the plurality of heat exchange pipes are connected to a splitter. The splitter is configured to allocate, to the plurality of heat exchange pipes, the refrigerating working substances from the evaporator. The second inlet end is disposed on the splitter, so that the splitter can be connected to an end of the evaporation pipeline. Second ends of the plurality of heat exchange pipes are connected to a collector. The collector is configured to aggregate refrigerating working substances obtained through heat exchange in the heat exchange pipes. The second outlet end is disposed on the collector, so that the collector is connected to an end of the liquid return pipeline.

With reference to any one of the first aspect to the twelfth possible implementation of the first aspect, in a thirteenth possible implementation of the first aspect, a plurality of heat dissipation apparatuses are disposed, and condensers in two or more heat dissipation apparatuses are disposed adjacent to each other. The condensers are used as the heat dissipation resource pools for sharing. Heat of heat source components with different heat dissipation requirements is drawn far to the heat dissipation resource pools through corresponding heat exchange loops, so that heat is exchanged between the heat dissipation resource pools and an external environment. There is no need to consider matching between resistance and air amounts of a plurality of plugboards, so that an air amount loss caused by resistance matching is greatly reduced, and a heat dissipation bottleneck caused by a difference between different specifications of the heat source components is reduced, thereby implementing rapid heat dissipation for a system with uneven heat.

With reference to any one of the first aspect to the twelfth possible implementation of the first aspect, in a fourteenth possible implementation of the first aspect, there are a plurality of heat dissipation apparatuses. Two or more heat dissipation apparatuses may share one condenser. To be specific, evaporation pipelines and liquid return pipelines in the two or more heat dissipation apparatuses are respectively connected to the second inlet end and the second outlet end of a same condenser. The same condenser is used as the heat dissipation resource pool, and air-cooling heat dissipation is performed on the condenser in combination with the fan. This can also implement rapid heat dissipation for a system with uneven heat.

With reference to any one of the first aspect to the fourteenth possible implementation of the first aspect, in a fifteenth possible implementation of the first aspect, the heat dissipation apparatus further includes a heat sink fastened to the evaporator. The heat of the heat source component is drawn far to the condenser for heat dissipation, and the heat sink dissipates heat of the evaporator, to implement heat dissipation in two places and improve a heat dissipation capability of the system. The heat sink may be a heat sink with a fin.

With reference to any one of the first aspect to the fifteenth possible implementation of the first aspect, in a sixteenth possible implementation of the first aspect, a working substance balancing apparatus is connected in series to the liquid return pipeline, and is configured to supplement the refrigerating working substance after maintenance of the heat exchange loop. In normal use, the working substance balancing apparatus stores specific mass of the refrigerating working substance. The refrigerating working substance in the liquid state from the condenser enters the evaporator after passing through the liquid return pipeline and the working substance balancing apparatus. After the condenser is replaced and maintained and the heat exchange loop is connected, the old condenser takes away some refrigerating working substances. During maintenance, the refrigerating working substance volatilizes, so that total mass of the refrigerating working substance in the heat exchange loop decreases. The working substance balancing apparatus is configured, to supplement the refrigerating working substance to the heat exchange loop, so that the heat exchange loop can be quickly put into use after maintenance, thereby improving convenience of maintenance.

With reference to the sixteenth possible implementation of the first aspect, in a seventeenth possible implementation of the first aspect, when the switch valve is disposed on the liquid return pipeline, in an extension direction of the liquid return pipeline, the working substance balancing apparatus is located on a side that is of the switch valve and that is away from the evaporator, so that the working substance does not flow back into the condenser.

According to a second aspect, an embodiment of this disclosure provides a communications device, including the heat dissipation cabinet described in the first aspect to the seventeenth possible implementation of the first aspect and at least one plugboard. Each plugboard is disposed in a first accommodation region, and each plugboard has one or more heat source components. Each evaporator is in thermal contact with an outer surface of the one or more heat source components.

With reference to the second aspect, in a first possible implementation of the second aspect, each evaporator is fastened to the outer surface of the one or more heat source components. To be specific, the evaporator and the heat source component are assembled together when the plugboard is manufactured. When the plugboard is assembled, the plugboard with the evaporator on the heat source component is directly assembled into a cabinet body, and a heat exchange loop is further formed in combination with another component. In this way, assembly efficiency can be improved, and the evaporator no longer needs to be installed on the heat source component on the spot.

With reference to the second aspect or the first possible implementation of the second aspect, in a second possible implementation of the second aspect, the plugboards are classified into a first plugboard and second a plugboard. All first plugboards are located at a front end of the cabinet body and stacked along a vertical direction, and all second plugboards are located at a rear end of the cabinet body and stacked along a horizontal direction. All heat source components installed on the first plugboards and the second plugboards in the cabinet body can draw, by using the foregoing heat dissipation apparatus, heat generated by the heat source components far to a condenser located in a second accommodation region. The condenser is used as a heat dissipation resource pool, and a fan is used to centrally cool the heat dissipation resource pool. In this way, a path of the second accommodation region is relatively short, heat dissipation efficiency is relatively high, and a heat dissipation capability is maximized.

With reference to the second possible implementation of the second aspect, in a third possible implementation of the second aspect, the communications device further includes a back panel. The back panel is disposed in the first accommodation region of the cabinet body. A first surface of the back panel has a first slot, and the first plugboard is pluggably installed in the first slot. A second surface of the back panel has a second slot, and the second plugboard is pluggably installed in the second slot. In this way, the heat dissipation cabinet becomes a pluggable system. The first plugboard, the second plugboard, and the back panel may be printed circuit boards. When the first plugboard or the second plugboard is plugged into the corresponding slot of the back panel, the back panel supplies power to the corresponding plugboard. Because the condenser is removed out of the plugboard, in space of a same size in the cabinet body, a quantity of slots on the back panel may increase to obtain a competitive advantage of the quantity of slots, and more first plugboards and second plugboards may be arranged to increase a device capacity.

With reference to the second aspect or the first possible implementation of the second aspect, in a fourth possible implementation of the second aspect, the plugboards are located at a front end of the cabinet body and stacked along a vertical direction. All heat source components installed on the plugboards in the cabinet body can draw, by using the foregoing heat dissipation apparatus, heat generated by the heat source components far to a condenser located in a second accommodation region. The condenser is used as a heat dissipation resource pool, and a fan is used to centrally cool the heat dissipation resource pool. In this way, a path of the second accommodation region is relatively short, heat dissipation efficiency is relatively high, and a heat dissipation capability is maximized.

With reference to the fourth possible implementation of the second aspect, in a fifth possible implementation of the second aspect, the communications device further includes a back panel. The back panel is disposed in the first accommodation region of the cabinet body. A first surface of the back panel has a first slot, and the plugboard is pluggably installed in the first slot, so that the heat dissipation cabinet becomes a pluggable system. When the plugboard is plugged into the first slot of the back panel, the back panel supplies power to the plugboard. Because the condenser is removed out of the plugboard, in space of a same size in the cabinet body, a quantity of slots on the back panel may increase to obtain a competitive advantage of the quantity of slots, and more plugboards may be arranged to increase a device capacity.

DESCRIPTION OF EMBODIMENTS

Heat dissipation cabinets provided in embodiments of this disclosure may be applied to a communications device, to dissipate heat of a heat source component in the communications device. The heat source component may be a high-power consumption chip or another element. Specifically, the communications device may be a data communications device, a data transmission device, an Internet technology device, or another multi-slot plugboard system, or may be a network communications device, a server device, and a base station unit device that have a plurality of slots for plugging and unplugging. The communications device may be applied to an operator room and a data center room, and may provide an Internet Protocol (IP) forwarding function, and a data transmission and computing function.

Figures 1A, 1B:
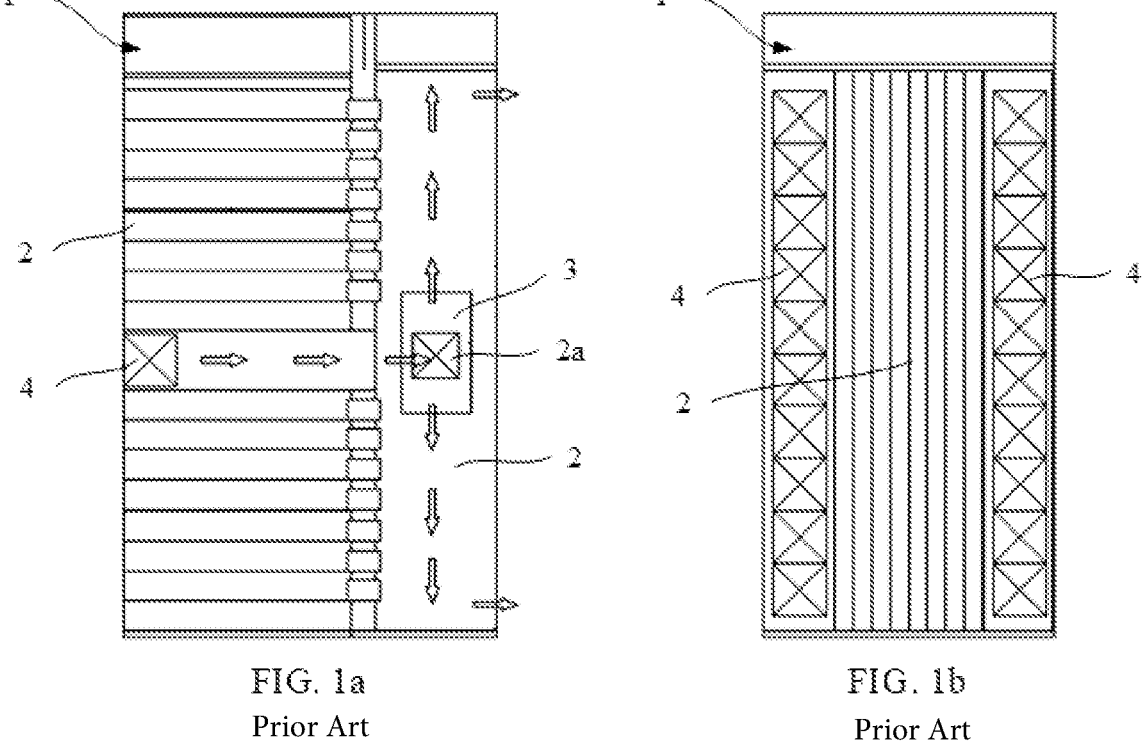
FIG. 1*a* is a side view of a communications device in the conventional technology.
FIG. 1*b* is a back view of the communications device in FIG. 1*a*.
Figure 2:
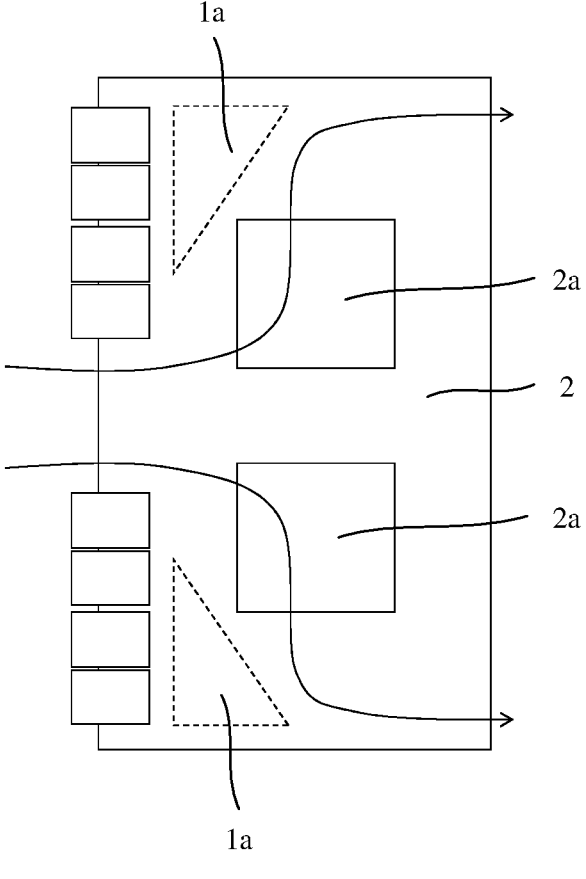
FIG. 2 is a schematic diagram of an air flow in slot space in a communications device in the conventional technology.
Figure 3:
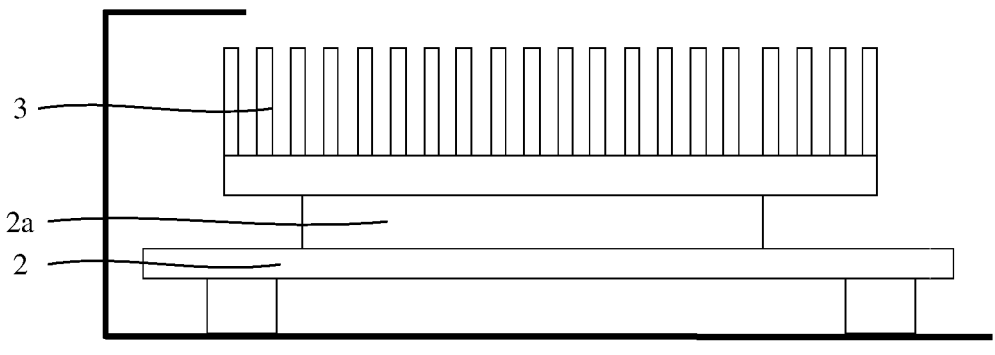
FIG. 3 is a schematic diagram of a structure of slot space in a communications device in the conventional technology.
Figure 4:
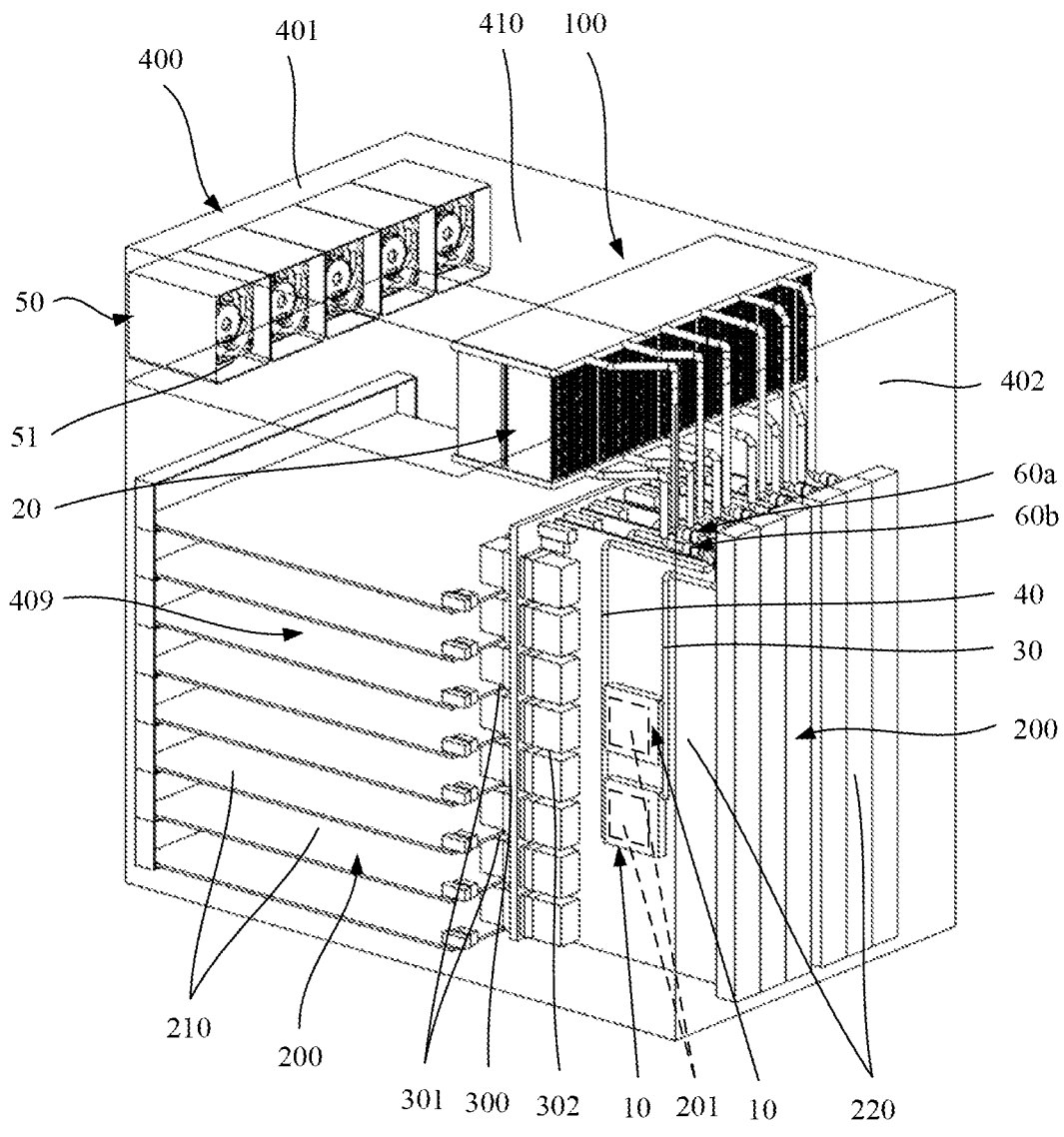
FIG. 4 is a diagram of a three-dimensional structure of a communications device according to an embodiment of this disclosure.

Referring to FIG. 4, an embodiment of this disclosure provides a heat dissipation cabinet, including a cabinet body 400 and at least one heat dissipation apparatus 100. The cabinet body 400 has a first accommodation region 409 and a second accommodation region 410. The first accommodation region 409 can accommodate, through stacking, plugboards 200 with heat source components 201. Each heat dissipation apparatus 100 includes at least one evaporator 10, at least one condenser 20, an evaporation pipeline 30, a liquid return pipeline 40, and a fan 50. Each evaporator 10 is configured to be in thermal contact with an outer surface of one or more heat source components 201. Each condenser 20 is disposed in the second accommodation region 410 and is located above the evaporator 10. In each heat dissipation apparatus 100, the evaporator 10 is connected to the condenser 20 by using the evaporation pipeline 30 and the liquid return pipeline 40 to form a heat exchange loop. The heat exchange loop is filled with refrigerating working substances. The fan 50 is configured to dissipate heat of the condenser 20 through air cooling.

In the heat dissipation cabinet provided in this embodiment of this disclosure, the first accommodation region 409 of the cabinet body 400 can accommodate the plugboards 200 through stacking, and heat of the heat source components 201 of the plugboards 200 is dissipated by using the heat dissipation apparatus 100. The evaporator 10, the condenser 20, the evaporation pipeline 30, and the liquid return pipeline 40 in the heat dissipation apparatus 100 are connected to form the heat exchange loop. The evaporator 10 is in thermal contact with the outer surface of the heat source component 201. The condenser 20 is disposed in the second accommodation region 410 of the cabinet body 400 and is located above the evaporator 10. Heat generated during working of the heat source component 201 is transferred to the refrigerating working substance in the evaporator 10. The refrigerating working substance in the evaporator 10 changes from a liquid state to a gas state after absorbing the heat. The refrigerating working substance in the gas state rises into the condenser 20 along the evaporation pipeline 30. The refrigerating working substance in the condenser 20 releases heat and changes into the refrigerating working substance in the liquid state, and then the refrigerating working substance in the liquid state returns to the evaporator 10 through the liquid return pipeline 40 under gravity. In this way, the refrigerating working substance circularly flows in the heat exchange loop, to draw the heat of the heat source component 201 far to the condenser 20, and rapidly take away the heat of the condenser 20 by using air generated by the fan 50, thereby implementing centralized heat dissipation.

Compared with a conventional air-cooling heat dissipation solution, in the solution in this embodiment, the second accommodation region 410 is used as an independent air duct, a path of the air duct is relatively short, and the fan 50 blows air to the condenser 20 in the second accommodation region 410. This may improve an air amount, reduce resistance of a system, and improve a convective heat exchange coefficient, thereby improving a convective heat exchange and heat dissipation capability, and overcoming a case in the conventional heat dissipation solution in which a low air speed region exists, causing a poor heat dissipation effect. In addition, the condenser 20 is removed out of the plugboard 200, so that a volume of the condenser 20 can be increased, to enlarge a heat dissipation area of convective heat exchange and reduce air resistance of the system, improve the convective heat exchange and heat dissipation capability, and overcome a case in the conventional heat dissipation solution in which a heat dissipation area of a heat sink is constrained by slot space. The condenser 20 is used as a heat dissipation resource pool. Heat of the heat source components 201 with different heat dissipation requirements is drawn far to the heat dissipation resource pool through the heat exchange loop, to implement rapid heat dissipation for a system with uneven heat, thereby overcoming a case in the conventional heat dissipation solution in which a heat dissipation effect is not good because air amounts in a slot are uneven. Compared with the conventional heat dissipation solution, this solution uses the heat dissipation cabinet in this embodiment of this disclosure, to reduce air resistance during heat dissipation, enlarge a heat dissipation area, and improve comprehensive heat dissipation performance. Because the condenser 20 is removed out of the plugboard 200, in space of a same size in the cabinet body 400, the first accommodation region 409 can accommodate more plug-boards 200 through stacking, to increase a device capacity.

Compared with an existing heat dissipation solution in which the heat source component is immersed in a sealed housing and filled with working substances, in the heat dissipation apparatus 100 in this embodiment of this disclosure, the evaporator 10 is in thermal contact with the outer surface of the heat source component 201, so that a relatively small evaporator 10 can be made, provided that effective heat exchange can be implemented between the evaporator 10 and the heat source component 201. In this way, mass of the refrigerating working substance filled in the heat exchange loop is relatively small, and use costs are relatively low. The evaporator 10 is easy to bond to and assemble with the outer surface of the heat source component 201, which can effectively overcome a case in which the heat source component is immersed in the working substance to cause chemical erosion of the component, thereby improving working reliability of the heat source component.

The refrigerating working substance has a gas-liquid phase interconversion characteristic. After absorbing heat, the refrigerating working substance changes from the liquid state to the gas state, and after releasing heat, the refrigerating working substance changes from the gas state to the liquid state.

Figure 5:
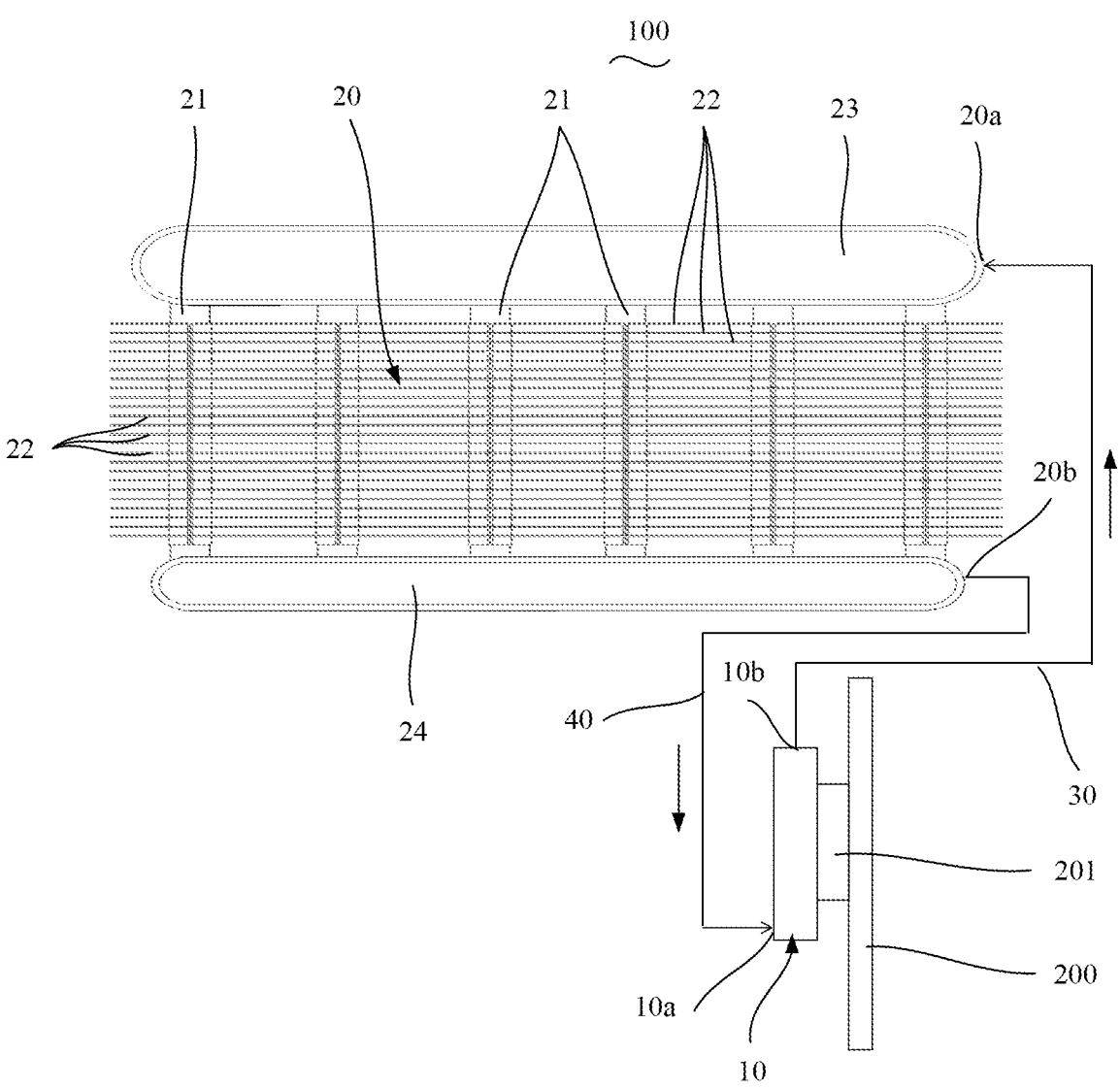
FIG. 5 is a schematic diagram of a structure of a heat exchange loop in a communications device according to an embodiment of this disclosure.

When the evaporator, the condenser, the evaporation pipeline, and the liquid return pipeline are specifically connected, referring to FIG. 5, in a same heat dissipation apparatus 100, each evaporator 10 has a first inlet end 10a and a first outlet end 10b, and each condenser 20 has a second inlet end 20a and a second outlet end 20b. Two ends of the evaporation pipeline 30 are respectively connected to the first outlet end 10b and the second inlet end 20a. Two ends of the liquid return pipeline 40 are respectively connected to the second outlet end 20b and the first inlet end 10a. The heat exchange loop is easy to assemble. The evaporator 10 is in thermal contact with the outer surface of the heat source component 201, and the condenser 20 is located above the evaporator 10. In this way, the refrigerating working substance can circularly flow in the heat exchange loop to continuously draw heat of the heat source component 201 far to the condenser 20, and perform air cooling in combination with the fan 50, to implement heat dissipation for the heat source component 201. Positions at which the evaporator 10 and the condenser 20 are respectively connected to the evaporator pipeline 30 and the liquid return pipeline 40 need to meet a leakage prevention requirement. It can be understood that, referring to FIG. 6, the second inlet end 20a and the second outlet end 20b in the condenser 20 may be two pipelines connected to the condenser.

When the evaporator and the plugboard are specifically disposed, referring to FIG. 5, the evaporator 10 may be fastened to a structure near the plugboard 200 or the heat source component 201, so that the plugboard 200 with the evaporator 10 is directly assembled into the cabinet body 400, and assembly and detachment operations both are convenient. The evaporator 10 may be a flat heat conducting housing, for example, having a shape of a cuboid. The evaporator 10 is pressed against the outer surface of the heat source component 201. In this way, heat generated during working of the heat source component 201 may be transferred to the refrigerating working substance inside the evaporator 10 through the heat conducting housing, so that the refrigerating working substance changes from the liquid state to the gas state. The evaporator 10 is compact in structure and occupies less space. In this way, in space of a same size, more heat source components 201 may be arranged, for example, high-power consumption chips may be more centrally arranged, to meet a large-capacity heat dissipation requirement of the chip. In addition, the evaporator 10 may be in another shape, and the evaporator 10 has a bonding surface bonded to the heat source component 201, to transfer heat from the heat source component 201 to the refrigerating working substance in the evaporator 10.

Referring to FIG. 5, when a single heat source component 201 is arranged along a vertical plane, correspondingly, the evaporator 10 is also arranged along the vertical plane, and the first inlet end 10a is located below the first outlet end 10b. In this way, after the refrigerating working substance in the liquid state in the evaporator 10 absorbs heat and changes into the gas state, the refrigerating working substance in the gas state may be exhausted through the first outlet end 10b located on an upper section of the evaporator 10, and is transmitted to the condenser 20 through the evaporation pipeline 30. The refrigerating working substance in the gas state releases heat in the condenser 20 and changes into the liquid state. The refrigerating working substance in the liquid state flows to the first inlet end 10a located on a lower section of the evaporator 10 and enters the evaporator 10 under gravity. When the heat source component 201 is horizontally arranged, the evaporator 10 is also horizontally arranged. In combination with the condenser 20 and the pipeline, the heat of the heat source component 201 can also be transferred to the condenser 20 for heat dissipation.

When the second accommodation region of the cabinet body is specifically disposed, referring to FIG. 4, the second accommodation region 410 may be located on an upper section of the cabinet body 400. The cabinet body 400 has an air inlet and an air outlet that communicate with the second accommodation region 410. For example, the air inlet is disposed on a front panel 401 of the cabinet body 400, and the air outlet is disposed on a rear panel 402 of the cabinet body 400. In this way, when the fan 50 is disposed in the second accommodation region 410, an air flow generated by the fan 50 enters the second accommodation region 410 through the air inlet on a front side of the cabinet body 400, to blow out, through the air outlet on a rear side of the cabinet body 400, air obtaining heat of the condenser 20. In addition, the second accommodation region 410 may be disposed at a proper position in the cabinet body 400 based on a space requirement of a system, for example, may be disposed at a position of a rear section close to a top section of the cabinet body 400. A shape of the second accommodation region 410 and positions of the air inlet and the air outlet may be disposed in another manner.

When the fan is specifically disposed, referring to FIG. 4, the fan 50 may be disposed in the second accommodation region 410 of the cabinet body 400. The fan 50 can be independently maintained or replaced. There may be one or more fans 50, which is not specifically limited. When a plurality of fans 50 are disposed, the plurality of fans 50 may be disposed in parallel. In this way, a structure is compact, so that all air generated by the fan 50 is provided to the condenser 20 to improve heat dissipation efficiency. The fan 50 may be an axial fan. An air exhaust side 51 of the fan 50 may face to an air intake side of the condenser 20, or an air intake side of the fan 50 may face to an air exhaust side of the condenser 20. In this way, air resistance is relatively small, and a heat dissipation effect is good.

It can be understood that when the heat dissipation cabinet is applied to an external environment, the heat dissipation cabinet may be disposed in a region with a relatively low temperature throughout a year and a sufficient air amount, so that heat of the condenser 20 can be dissipated through air cooling by using natural wind.

Figure 6:
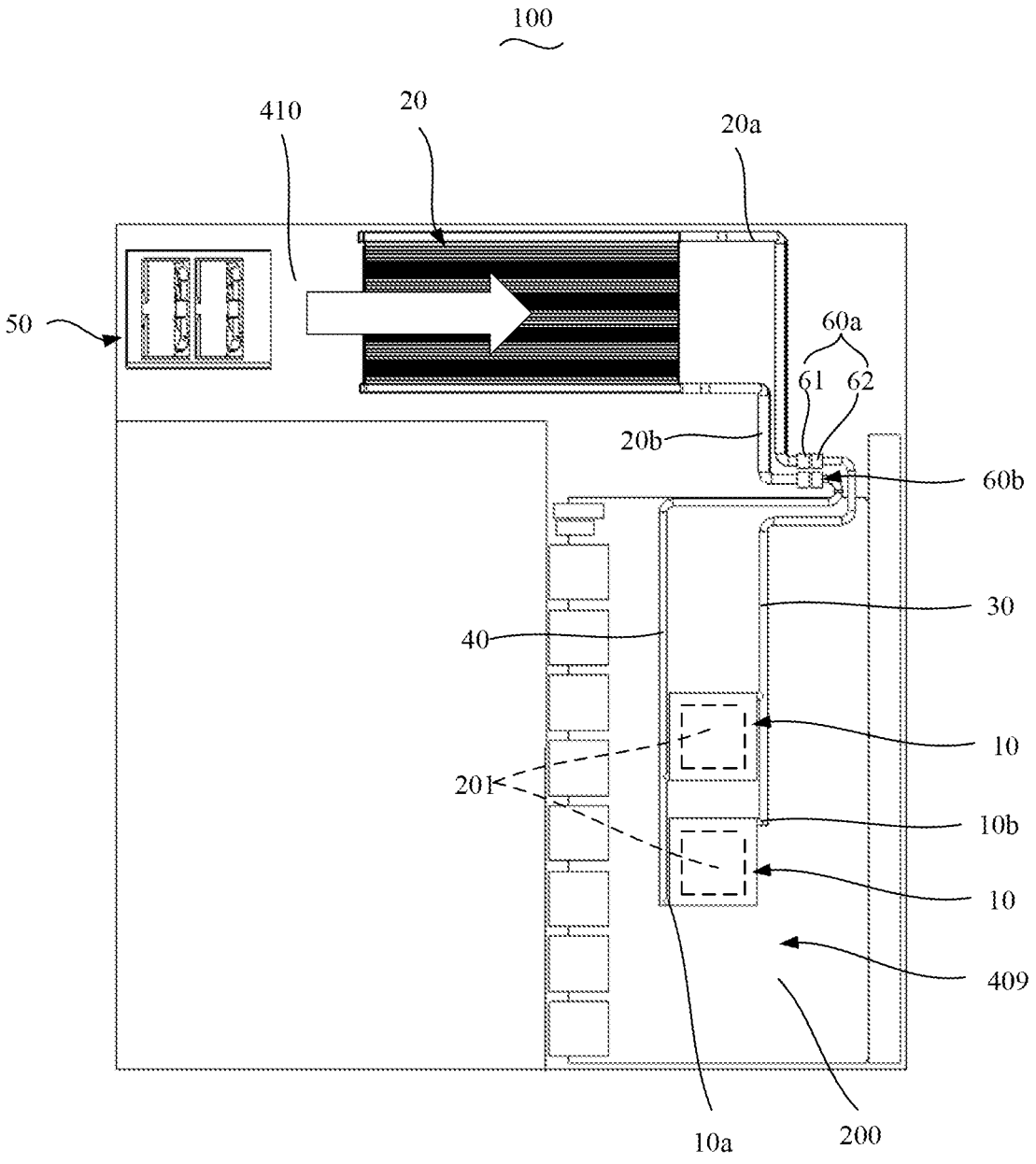
FIG. 6 is a side view of a communications device according to another embodiment of this disclosure.

In another embodiment of this disclosure, to separately maintain or replace the condenser or the plugboard with the evaporator, referring to FIG. 6, the second inlet end 20a of the condenser 20 is detachably connected to the evaporation pipeline 30 by using a first fast switching connector 60a, and the second outlet end 20b of the condenser 20 is detachably connected to the liquid return pipeline 40 by using a second fast switching connector 60b. The fast switching connector is used to facilitate assembly and detachment between the condenser 20 and each of the evaporation pipeline 30 and the liquid return pipeline 40, to separately maintain or replace the condenser 20 or the plugboard 200 with the evaporator 10. For example, when a condenser 20 needs to be replaced with a new one in a specific heat exchange loop, a corresponding fast switching connector is disconnected, the new condenser 20 is installed at a predetermined position, and then the new condenser 20 communicates with the evaporation pipeline 30 and the liquid return pipeline 40 by using the fast switching connector, to complete assembly. For another example, when a specific plugboard 200 with the evaporator 10 needs to be replaced, similarly, a corresponding fast switching connector is disconnected, and after the specific plugboard 200 is replaced with a new plugboard 200 with the evaporator 10, the fast switching connector is connected to implement connection of the heat exchange loop and replacement of the plugboard 200.

Both the first fast switching connector 60a and the second fast switching connector 60b include a male connector 61 and a female connector 62. One of two positions in a port of the condenser 20 and an end of the pipeline is connected to the male connector 61, and the other position is connected to the female connector 62. When the male connector 61 is connected to the female connector 62, a sealing connection can be implemented. In this way, rapid connection and disconnection between the condenser 20 and the pipeline can be implemented.

Compared with a heat dissipation solution in which the heat exchange loop is disposed on the plugboard, in this embodiment, the condenser 20 may be detached from the plugboard 200 with the evaporator 10, and may be installed outside the plugboard 200 to be independent of the plugboard 200. A volume of the condenser 20 is not limited, and a heat dissipation area may be enlarged. In addition, because space of the condenser 20 is independent, an air flow passing through the condenser 20 is not hindered by another part in the plugboard 200. This greatly reduces resistance, and improves an air amount of the system, thereby facilitating improvement of a convective heat exchange and heat dissipation capability.

In addition, in the first fast switching connector 60a or the second fast switching connector 60b, the male connector 61 and the female connector 62 have a sealing function. When the male connector 61 is disconnected from the female connector 62, correspondingly, an end of the evaporation pipeline 30, an end of the liquid return pipeline 40, or the port of the condenser 20 may be sealed, to reduce leakage of the working substance in the liquid return pipeline 40, the evaporation pipeline 30, or the condenser 20.

In some embodiments, to improve efficiency of assembling the first fast switching connector and the second fast switching connector, a section that is of the pipeline and that is configured to connect to the fast switching connector may be disposed as a flexible pipe. The flexible pipe facilitates adjustment of a position of the fast switching connector, to implement fast connection and assembly of the fast switching connector. For example, a section that is of the evaporation pipeline and that is configured to connect to the first fast switching connector is a flexible pipe, and the rest section of the evaporation pipeline is a rigid pipe. Alternatively, the evaporation pipeline is a flexible pipe. The first fast switching connector can be quickly assembled and detached in both two manners. Similarly, a section that is of the liquid return pipeline and that is configured to connect to the second fast switching connector is a flexible pipe, and the rest section of the liquid return pipeline is a rigid pipe. Alternatively, the liquid return pipeline is a flexible pipe. The second fast switching connector can be quickly assembled and detached in both two manners. The flexible pipe may be a hose, a corrugated pipe, or another flexible pipe.

In addition, the evaporation pipeline 30, the liquid return pipeline 40, and the condenser 20 may be maintained as a whole. The evaporation pipeline 30 and the liquid return pipeline 40 may be rigid pipes or flexible pipes.

Figure 7:
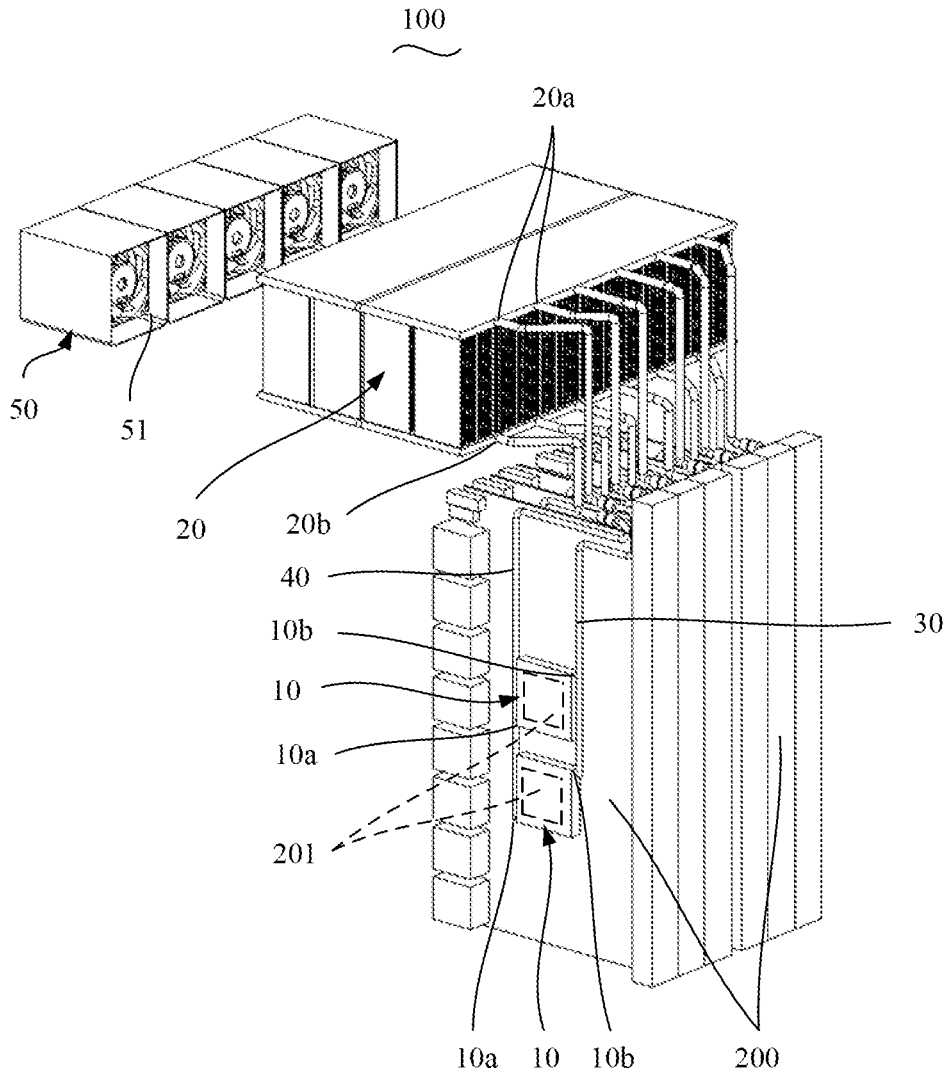
FIG. 7 is a diagram of three dimensional assembly of the communications device in FIG. 6.

In some embodiments, referring to FIG. 6 and FIG. 7, to implement heat dissipation for a system with uneven heat, a plurality of heat dissipation apparatuses 100 are disposed, and condensers 20 in two or more heat dissipation apparatuses 100 are disposed adjacent to each other. The system with uneven heat may be a plurality of plugboards with different layouts of the heat source components. When conventional air-cooling heat dissipation is performed, different plugboards have different air resistance, and a difference between corresponding air amounts is relatively large. For conventional air-cooling heat dissipation is performed on the system with uneven heat, a system resistance baseline is calibrated, to prevent a plugboard with relatively low air resistance from absorbing most of air for heat dissipation. However, the resistance baseline is usually calibrated based on highest air resistance. As a result, a working point of the system is relatively high, and an amount of air output by the fan becomes smaller, and a heat dissipation capability is sacrificed. Generally, a low-resistance plugboard has low power consumption, and requires a relatively small amount of air. If a low-resistance plugboard and a high-resistance plugboard are disposed in a same system for heat dissipation, because a low-power consumption plugboard has low resistance, air is easier to flow through the low-resistance plugboard. However, the system has a fixed amount of air. Therefore, an amount of air obtained by the high-resistance plugboard decreases, and a heat dissipation effect is worse. In this embodiment, condensers 20 in a plurality of heat dissipation apparatuses 100 are centrally disposed adjacent to each other, and are used as the heat dissipation resource pools for sharing. Heat of heat source components 201 with different heat dissipation requirements is drawn far to the heat dissipation resource pools through corresponding heat exchange loops, so that heat is exchanged between the heat dissipation resource pools and an external environment. There is no need to consider matching between resistance and air amounts of a plurality of plugboards, so that an air amount loss caused by resistance matching is greatly reduced, and a heat dissipation bottleneck caused by a difference between different specifications of the heat source components 201 is reduced, thereby implementing rapid heat dissipation for a system with uneven heat. The condensers 20 may be arranged in an array. In this way, a structure is compact, so that an air flow passes through the adjacent condensers 20 to take away heat.

When the fan 50 is disposed, an air flow generated by the fan 50 diffuses heat of refrigerating working substances in the plurality of condensers 20 to the outside. For example, the condensers 20 in the plurality of heat dissipation apparatuses 100 are arranged in an array. In this way, a structure is compact, which helps the fan 50 blow air to the plurality of condensers 20, thereby improving heat dissipation efficiency. The condensers 20 may be extended along different horizontal directions based on space of a system, which can improve a convective heat exchange area, and overcome a case in the conventional heat dissipation solution in which a heat dissipation area of a heat sink is constrained by slot space, so that a heat dissipation capability is stronger. There may be one or more condensers 20, which is not specifically limited.

In addition, referring to FIG. 7, there are a plurality of heat dissipation apparatuses 100. Two or more heat dissipation apparatuses 100 may share one condenser 20. To be specific, evaporation pipelines 30 and liquid return pipelines 40 in the two or more heat dissipation apparatuses 100 are respectively connected to the second inlet end 20a and the second outlet end 20b of a same condenser 20. The same condenser 20 is used as the heat dissipation resource pool, and air-cooling heat dissipation is performed on the condenser 20 in combination with the fan 50. This can also implement rapid heat dissipation for a system with uneven heat. There may be a plurality of second inlet ends 20a and a plurality of second outlet ends 20b on the condenser 20, so that the evaporation pipelines 30 and the liquid return pipelines 40 in different heat dissipation apparatuses 100 are connected to the condenser 20. A quantity of heat dissipation apparatuses 100 corresponding to one condenser 20 may be set based on a requirement.

When the evaporator and the heat source component are specifically configured, referring to FIG. 5, in a same heat dissipation apparatus 100, the evaporator 10 is connected between the evaporation pipeline 30 and the liquid return pipeline 40, and the evaporator 10 is configured to be in thermal contact with one or more heat source components 201. In other words, the evaporator 10 and the heat source component 201 may be in a one-to-one correspondence, or one evaporator 10 may correspond to a plurality of heat source components 201. Heat generated during working of the heat source components 201 is transferred to the refrigerating working substance in the evaporator 10 and circularly flows in the heat exchange loop by using the refrigerating working substance, and the refrigerating working substance in the condenser 20 releases heat to dissipate the heat of the heat source components 201. When a same evaporator 10 is in thermal contact with a plurality of heat source components 201, the plurality of heat source components 201 are disposed adjacent to each other. The evaporator 10 absorbs heat from the heat source components 201, and can dissipate the heat of the heat source components 201 in combination with another component in the heat dissipation apparatus 100.

In some embodiments, to implement heat dissipation for a plurality of heat source components or heat dissipation for heat source components of different temperature specifications, referring to FIG. 6 and FIG. 7, in a same heat dissipation apparatus 100, a plurality of evaporators 10 are connected between the evaporation pipeline 30 and the liquid return pipeline 40, that is, the evaporators 10 are connected in parallel between the evaporation pipeline 30 and the liquid return pipeline 40. Each evaporator 10 is in thermal contact with a corresponding heat source component 201. Heat generated by different heat source components 201 during working is transferred to refrigerating working substances in corresponding evaporators 10 and circularly flows in the heat exchange loop by using the refrigerating working substances. The condensers 20 are used as the heat dissipation resource pool, and the refrigerating working substances in the condensers 20 release heat to dissipate the heat, so that heat dissipation resources of the heat source components 201 of different specifications are shared, to improve a heat dissipation effect. The different heat source components 201 may be different heat source components 201 on a same plugboard 200, or may be heat source components 201 on different plugboards 200.

When the condenser is specifically disposed, referring to FIG. 5, each condenser 20 includes a plurality of heat exchange pipes 21 and a plurality of heat dissipation fins 22. Several heat exchange pipes 21 are disposed in parallel at intervals. A first end of each heat exchange pipe 21 communicates with the second inlet end 20a, and a second end of each heat exchange pipe 21 communicates with the second outlet end 20b. The heat dissipation fins 22 are connected to the heat exchange pipes 21. The plurality of heat exchange pipes 21 are disposed in parallel, and the heat dissipation fins 22 are disposed on the heat exchange pipes 21. In this way, a contact area between the heat exchange pipes 21 and the heat dissipation fins 22 can be enlarged, and the heat dissipation fins 22 can enlarge a heat dissipation area. When passing through the heat exchange pipe 21, the refrigerating working substance in the gas state from the evaporator 10 releases heat and is converted from the gas state to the liquid state. Heat of the refrigerating working substance in the heat exchange pipe 21 is transferred to the heat dissipation fin 22 through a side wall of the heat exchange pipe 21, and then diffused into an external environment, to implement rapid heat dissipation. When the fan is configured, heat exchange occurs between an air flow generated by the fan and the heat dissipation fin 22, and the air flow takes away heat of the heat dissipation fin 22. In a same condenser 20, the second inlet end 20a is located above the second outlet end 20b, so that the refrigerating working substance in the gas state from the evaporator 10 rises through the evaporation pipeline 30 to be transferred to the second inlet end 20a, then enters the condenser 20 and releases heat to change from the gas state to the liquid state, and is further output through the second outlet end 20b under gravity. This reduces internal resistance of the pipeline, and helps improve a heat dissipation effect.

When the heat exchange pipe, the evaporation pipeline, and the liquid return pipeline are specifically connected, referring to FIG. 5, first ends of the plurality of heat exchange pipes 21 are connected to a splitter 23. The splitter 23 is configured to allocate, to the plurality of heat exchange pipes 21, the refrigerating working substance from the evaporator 10. The second inlet end 20a is disposed on the splitter 23, so that the splitter 23 can be connected to an end of the evaporation pipeline 30. Second ends of the plurality of heat exchange pipes 21 are connected to a collector 24. The collector 24 is configured to aggregate refrigerating working substances obtained through heat exchange in the heat exchange pipes 21. The second outlet end 20b is disposed on the collector 24, so that the collector 24 is connected to an end of the liquid return pipeline 40. For example, the splitter 23 and the collector 24 may be flat housings, and the housings each have a plurality of connection ports configured to plug ends of the heat exchange pipes 21. In this way, a structure is compact and easy to assemble, so that allocation or aggregation of the refrigerating working substances can be implemented. In addition, the splitter 23 and the collector 24 may be structures of another shape.

Figure 8:
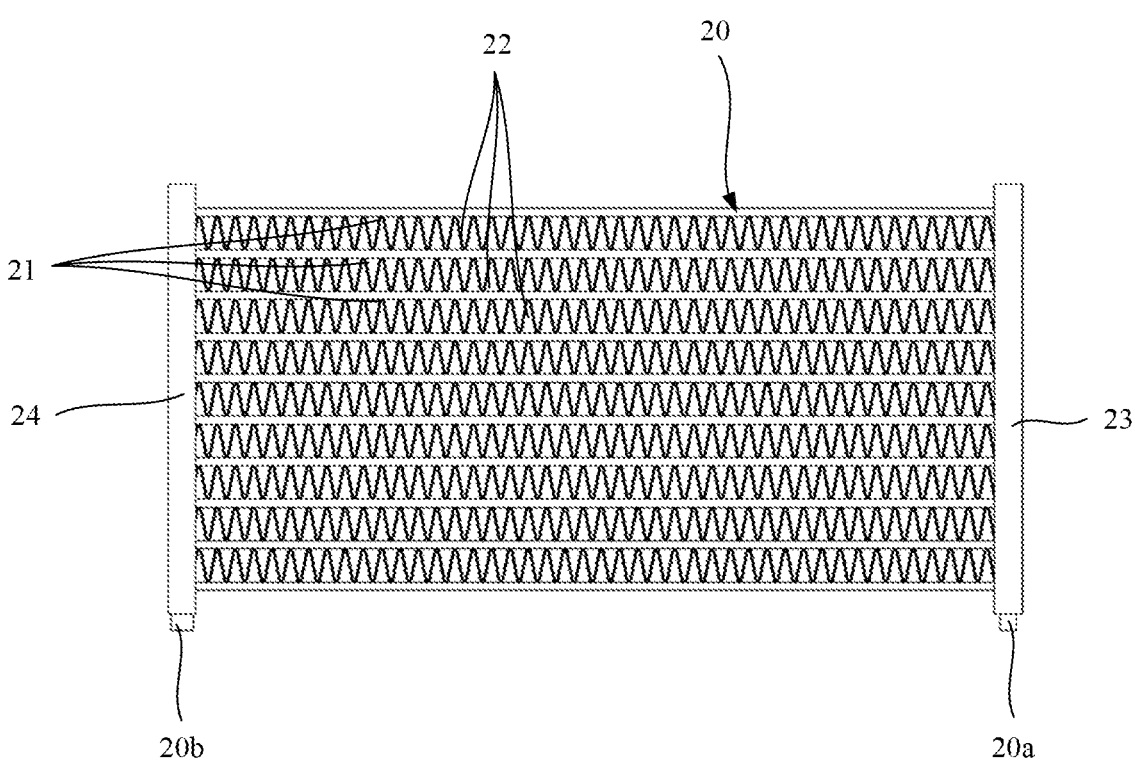
FIG. 8 is a schematic diagram of a structure of a condenser in a communications device according to another embodiment of this disclosure.

When the heat exchange pipe is connected to the heat dissipation fin, there are a plurality of optional implementations. A first optional implementation is as follows: Referring to FIG. 5, the plurality of heat exchange pipes 21 are disposed in parallel, the plurality of heat dissipation fins 22 are disposed at intervals, and each heat dissipation fin 22 is connected to the plurality of heat exchange pipes 21. A second optional implementation is as follows: Referring to FIG. 8, the plurality of heat exchange pipes 21 are disposed in parallel, and a corrugated heat dissipation fin 22 is connected between two adjacent heat exchange pipes 21. The two manners may be adapted based on space of different structures, and an assembly process is simple, so that an overall structure for the heat exchange pipe 21 and the heat dissipation fin 22 is compact, and heat of the plurality of heat exchange pipes 21 is evenly transferred to the plurality of heat dissipation fins 22, to make temperatures of the plurality of heat exchange pipes 21 to be even, thereby rapidly implementing heat dissipation for the condenser 20. The heat dissipation fin 22 may be connected to the heat exchange pipe 21 through welding or another manner. This is easy to manufacture, to implement reliable thermal contact between the heat dissipation fin 22 and the heat exchange pipe 21.

In addition, when the condenser is specifically disposed, the condenser may be a panel heat exchanger. The condenser needs to be disposed above the evaporator, so that the refrigerating working substance circularly flows in the heat exchange loop. The refrigerating working substance in the condenser releases heat and the heat is transferred to the condenser, and the fan blows air to the condenser, so that heat of the heat source component can also be drawn far to the condenser for centralized heat dissipation.

In some embodiments, to improve efficiency of heat dissipation for the heat source component 201, the heat dissipation apparatus 100 further includes a heat sink (not shown in the figure) fastened to the evaporator 10. The heat of the heat source component 201 is drawn far to the condenser 20 for heat dissipation, and the heat sink dissipates heat of the evaporator 10, to implement heat dissipation in two places and improve a heat dissipation capability of the system. The heat sink may be a heat sink with a fin.

In the heat exchange loop, because a working substance in the liquid state at an evaporation end (on an evaporator side) is heated to become the gas state, a working substance at a condensation end (on a condenser side) is cooled to become the liquid state. Therefore, in environments of different working temperatures, the mass of the working substance remaining in a pipeline at the evaporation end (the evaporation pipeline and the liquid return pipeline) is incompletely consistent with the mass of the working substance remaining in a pipeline at the condensation end (pipelines corresponding to the inlet end and the outlet end of the condenser). When the pipeline at the evaporation end in the plugboard and the pipeline at the condensation end outside the plugboard are plugged and unplugged, total mass of the working substance in the entire heat exchange loop is inconsistent during replacement through plugging and unplugging at different temperatures, resulting in inconsistent heat dissipation capabilities in the entire heat exchange loop.

Figure 12:
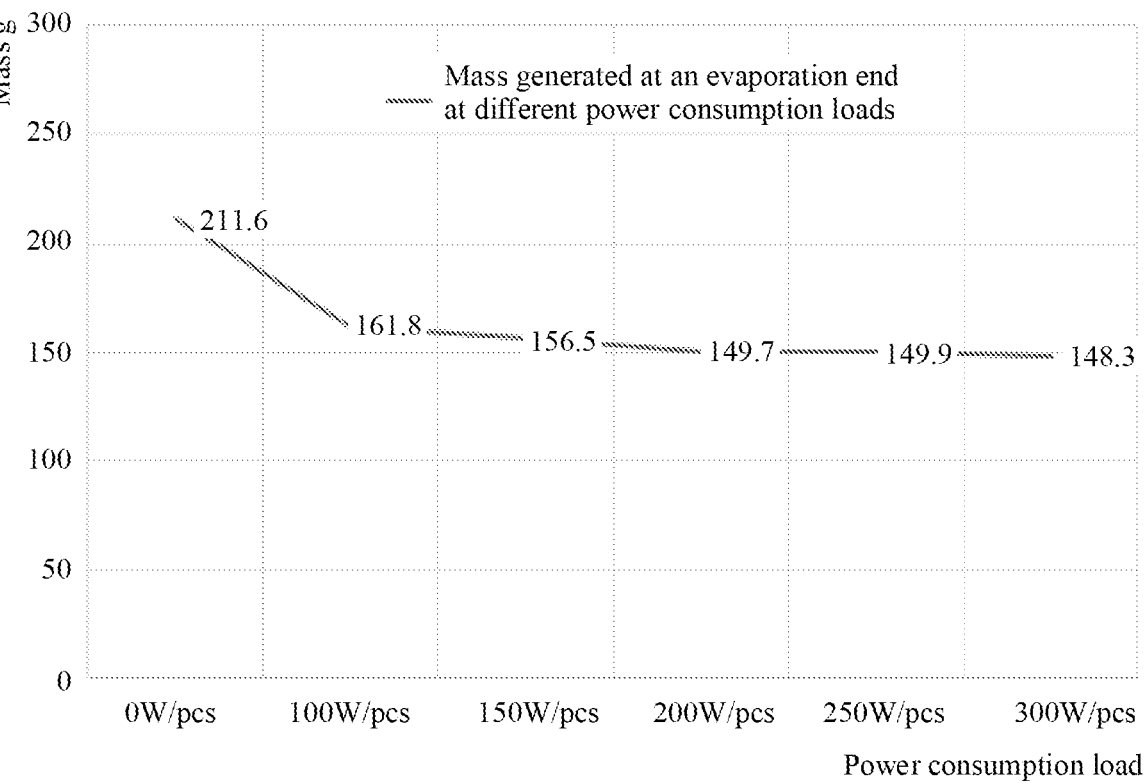
FIG. 12 is a schematic diagram of mass that is of a working substance in a heat exchange loop and that is measured when a plugboard is in different states.

For example, FIG. 12 shows mass that is of the working substance in the heat exchange loop and that is actually measured when the plugboard is in different states. A mass difference between the working substance at the evaporation end generated when the plugboard is powered off and in a cooling state and the working substance at the evaporation end generated when the plugboard is powered on and operates with full power consumption is relatively large. For example, when the plugboard has low power consumption, mass of the working substance in the liquid state at the evaporation end is 211.6 g. However, when the plugboard has power consumption of 100 W, the mass of the working substance in the liquid state at the evaporation end is 161.8 g. Therefore, the working substance is reduced by 49.8 g. As power consumption of the plugboard gradually increases, the mass of the working substance at the evaporation end gradually decreases, especially, the mass of the working substance decreases at a relatively high rate when the plugboard has power consumption within 100 W. In this case, if a plugboard in the cooling state replaces a working plugboard in a heating state, mass of the working substance remaining at the evaporation end is excessively large after the plugboards are exchanged through plugging and unplugging. As a result, a final heat dissipation capability of the heat exchange loop is greatly affected by mass of internal working substance. In addition, if a plugboard in a working state is unplugged, mass of the working substance in the plugboard is relatively small. Therefore, when the plugboard cooperates with another back panel, mass of the working substance in a new heat exchange loop including the evaporator and the condenser is reduced.

Figure 13:
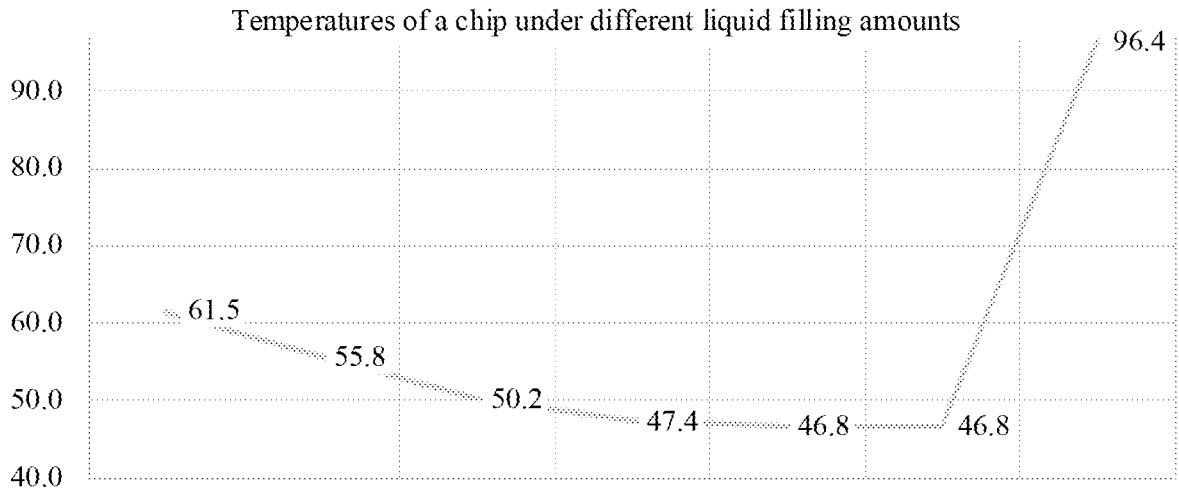
FIG. 13 is a schematic diagram of influence made by a working substance in a heat exchange loop on heat dissipation efficiency.

However, excessively less or more working substances lead to a decrease in heat exchange efficiency of the heat exchange loop. As shown in FIG. 13, excessively more working substances lead to an increase in both evaporation thermal resistance and condensation thermal resistance, and a heat dissipation capability of a chip on the plugboard is limited. As a result, a working temperature of the chip is relatively high. However, excessively less working substances lead to "dry burning" at the evaporation end of the plugboard, and the temperature of the chip is more prone to sharply rise to cause over-temperature damage. As shown in FIG. 13, when a liquid filling amount (the working substance in the liquid state) is less than 40%, the temperature of the chip rapidly soars.

Figure 14:
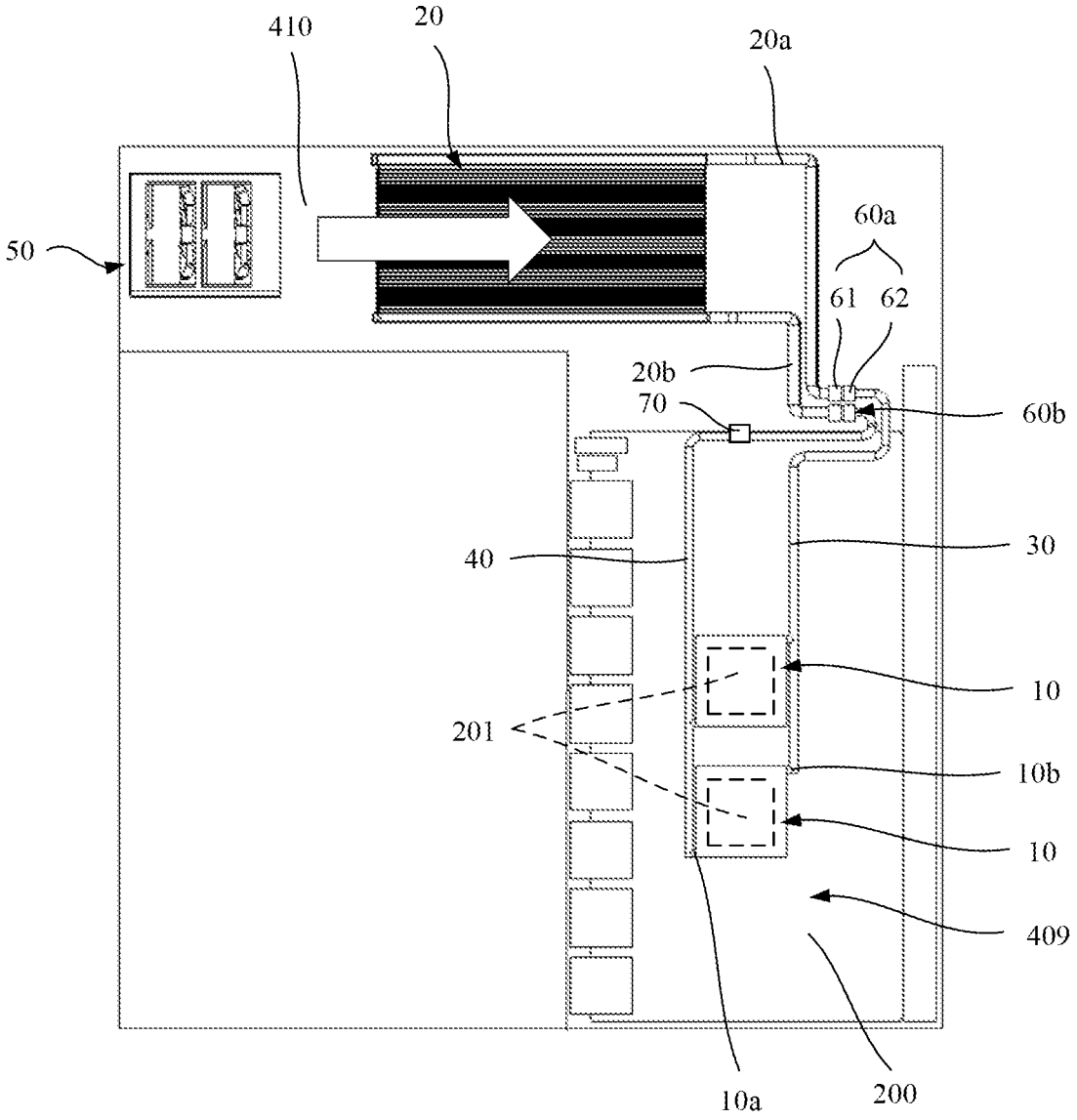
FIG. 14 is a side view of a communications device according to another embodiment of this disclosure.

To reduce influence made on a heat dissipation effect by replacement of a plugboard, as shown in FIG. 14, a switch valve 70 is disposed on at least the liquid return pipeline 40, to control the liquid return pipeline 40 to be turned off. For example, when the liquid return pipeline 40 is connected to the first inlet end of the evaporator 10, the switch valve 70 for controlling the liquid return pipeline 40 to be turned on is disposed on the liquid return pipeline 40. The switch valve 70 for controlling the working substance is disposed in the heat exchange loop to effectively control mass of the working substance. The switch valve 70 may be a normally on electromagnetic valve (the valve is turned on when being powered on, and is immediately turned off when being powered off), may be a temperature valve (the valve is turned on at a specific temperature and is turned off at a specific temperature), or may be another control valve that can achieve a same purpose. The switch valve 70 is used to control the mass of the working substance at the evaporation end to be stable, to ensure that a cooling capability of the entire heat exchange loop keeps constant after the plugboards are exchange through plugging and unplugging at different temperatures. For example, the switch valve 70 may be an electromagnetic valve, a memory alloy temperature control valve, or another valve that can control allocation of the mass of the working substance.

When being disposed, the switch valve 70 may be disposed on different pipelines. For example, the switch valve 70 is disposed on the liquid return pipeline 40, and is located at an end that is of the liquid return pipeline 40 and that is close to the second fast switching connector 60b, so that the switch valve 70 can cooperate with the second fast switching connector 60b to seal the working substance. Certainly, the switch valve 70 may be disposed at another position of the liquid return pipeline 40. This is not specifically limited in this embodiment of this disclosure.

Alternatively, the switch valve 70 is disposed on both the liquid return pipeline 40 and the evaporation pipeline 30. When the plugboard 200 is powered off and does not work, the working substance in the liquid state in the condenser 20 may flow back to the liquid return pipeline 40, and a small part of the working substance in the liquid state may flow back to the evaporation pipeline 30. To prevent the working substance in the liquid state from flowing back to increase mass of the working substance in the plugboard, when the switch valve 70 is disposed, the switch valve 70 is disposed on both the liquid return pipeline 40 and the evaporation pipeline 30, so that after the plugboard is powered off, the liquid return pipeline 40 and the evaporation pipeline 30 are respectively turned off by using the two switch valves 70, to prevent the working substance in the liquid state in the condenser 20 from flowing into the plugboard 200. In this way, when the plugboard is powered on or powered off, mass of the working substance in the liquid state in the plugboard is basically consistent, to prevent mass of the working substance in the entire heat exchange loop from being affected when the plugboard is plugged and unplugged.

The switch valve 70 may be controlled by using an electrical signal or a temperature signal. The two cases are separately described below.

When the switch valve 70 is controlled by using the electrical signal, the switch valve 70 may be an electromagnetic control valve, and the switch valve 70 may be controlled by using a control unit disposed on the plugboard 200. For example, the switch valve 70 is the electromagnetic control valve, and the control unit may be configured to control on and off of the electromagnetic control valve. When the plugboard 200 is plugged into the back panel, the plugboard 200 is powered on, and the control unit controls, based on a detected signal indicating that the plugboard 200 is powered on, the electromagnetic control valve to be turned on. When the plugboard 200 is unplugged from the back panel, the plugboard 200 is powered off, and the control unit controls, based on a detected signal indicating that the plugboard 200 is powered off, the electromagnetic control valve to be turned off. In the foregoing state, the electromagnetic control valve is a normally off control valve, so that after the plugboard 200 is powered off, the electromagnetic control valve can keep in a normally off state, and cooperates with the fast switching connector 60 at a port of the liquid return pipeline 40 to seal the working substance in the pipe.

The control unit may be a control circuit disposed on the plugboard 200. When the plugboard 200 is conductively connected to the back panel of the heat dissipation cabinet, the control circuit controls the electromagnetic control valve to be turned on. Certainly, the control unit may be common control units such as a PLC and a relay that can control the electromagnetic control valve.

If foregoing electrical signal control is used, when the plugboard 200 is powered off, the switch valve 70 keeps in a normally on state. After the plugboard 200 is powered on (the plugboard 200 is correctly plugged into a chassis), the switch valve 70 is turned on, may be turned on in real time, or may be turned on after a delay of a period of time, for example, 10 ms, 15 ms, or 20 ms.

When the switch valve 70 is controlled by a temperature, the switch valve 70 may be a temperature valve, for example, a memory alloy temperature control valve. After the plugboard 200 is powered on, a control section (a memory alloy) in the memory alloy temperature control valve compresses, to drive the memory alloy temperature control valve to act, thereby turning on the valve. After the plugboard 200 is powered off, the control section (the memory alloy) in the memory alloy temperature control valve compresses, to drive the memory alloy temperature control valve to act, thereby turning on the valve.

In addition, the switch valve 70 may alternatively be an electromagnetic control valve. Correspondingly, the plugboard 200 further includes a sensor and a control unit. The sensor is configured to detect a temperature of a heat source (a chip), and the control unit is configured to: when the temperature detected by the sensor exceeds a specified value, control the electromagnetic control valve to be turned on. For example, when the temperature of the chip is greater than 80 degrees (a T1 threshold), the switch valve 70 is turned on; and when the temperature of the chip is less than 60 degrees (a T2 threshold), the switch valve 70 is turned off.

When the switch valve 70 is specifically controlled, the switch valve 70 may be controlled through separate temperature control and electrical control, or may be controlled through a combination of temperature control and electrical control. This is not specifically limited in this embodiment of this disclosure.

When the plugboard is plugged into the back panel, the heat exchange loop is filled with the working substance. To help fill the working substance into the heat exchange loop, a liquid filling hole may be disposed on the plugboard. The working substance may be filled into the liquid return pipeline 40, the evaporation pipeline 30, and the evaporator 10 through the liquid filling hole.

The liquid filling hole may be disposed on the liquid return pipeline 40, the evaporation pipeline 30, or the evaporator 10. For example, the liquid filling hole is disposed on the evaporation pipeline 30. However, it should be understood that, in this embodiment of this disclosure, the liquid filling hole may be disposed at different positions based on an actual requirement. This is not specifically limited in this embodiment of this disclosure. The liquid filling hole is also a vacuuming hole for vacuuming a pipe on the plugboard 200. For example, a vacuum pump is connected to the liquid filling hole for vacuum pumping, and then a liquid filling pump fills the working substance into the pipe through the liquid filling hole.

When the plugboard 200 is filled with liquid, a liquid filling amount in the plugboard 200 is determined based on mass of the working substance on the liquid return pipeline 40 and the evaporation pipeline 30 in a working state of the plugboard 200. For example, when the plugboard 200 is normally powered on and works, if mass of the working substance in the plugboard 200 is 100 g to 180 g, mass of the working substance filled into the pipeline in the plugboard 200 is from 100 g to 180 g, for example, different mass such as 100 g, 130 g, or 150 g. When the mass of the working substance in the plugboard 200 is mass of the working substance included in the plugboard 200 when the plugboard 200 normally works, it is avoided that after excessively large mass of the working substance is filled, a heat dissipation effect of the heat exchange loop including the evaporator 10 and the condenser 20 is affected because there is excessively large mass of the working substance in the entire heat exchange loop after the plugboard 200 is connected to the back panel. In addition, when the plugboard 200 is powered off, the switch valve 70 is turned off, and the working substance in the liquid state in the condenser 20 cannot flow into the pipeline of the plugboard 200, so that mass of the working substance in the plugboard 200 remains basically unchanged. Therefore, when the plugboard 200 is plugged into another back panel, mass of the working substance in the heat exchange loop including the evaporator 10 and the condenser 20 does not excessively change.

To facilitate understanding of a change status of the working substance in the plugboard 200, a working state of the plugboard 200 is described in detail. After the plugboard 200 is powered on, the electromagnetic valve is turned on, and the evaporator 10 communicates with the condenser 20 to form the heat exchange loop. The chip is powered on and generates heat, and the working substance in the liquid state changes into the gas state after the evaporator 10 absorbs heat through evaporation, and enters the condenser 20 through the evaporation pipeline 30. The working substance is condensed in the condenser 20 to release heat and then changes into the liquid state. The working substance in the liquid state returns to the evaporator 10 through the liquid return pipeline 40, to form a circular loop for heat transfer. When the plugboard 200 is powered off, the electromagnetic valve is quickly turned off and disconnected, the heat exchange loop is disconnected, and mass of the working substance in the entire loop remains unchanged. It can be learned from the foregoing description that corresponding mass of the working substance on the corresponding plugboard 200 is basically the same regardless of whether the plugboard 200 is plugged and unplugged when being powered on (in a working state) or the plugboard 200 is plugged and unplugged when being powered off (in a non-working state). Therefore, maintaining and replacing a new plugboard 200 or exchanging plugboards 200 in different slots does not cause a relatively large change in the mass of the working substance in the loop, thereby maintaining stability of a heat dissipation capability.

In some embodiments, to rapidly supplement the refrigerating working substance after maintenance of the heat exchange loop, a working substance balancing apparatus (not shown in the figure) is connected in series to the liquid return pipeline 40. In normal use, the working substance balancing apparatus stores specific mass of the refrigerating working substance. The refrigerating working substance in the liquid state from the condenser 20 enters the evaporator 10 after passing through the liquid return pipeline 40 and the working substance balancing apparatus. After the condenser 20 is replaced and maintained and the heat exchange loop is connected, the old condenser 20 takes away some refrigerating working substances. During maintenance, the refrigerating working substance volatilizes, so that total mass of the refrigerating working substance in the heat exchange loop decreases. The working substance balancing apparatus is configured, to supplement the refrigerating working substance to the heat exchange loop, so that the heat exchange loop can be quickly put into use after maintenance, thereby improving convenience of maintenance. The working substance balancing apparatus has a function of buffering and stabilizing distribution of the working substance, to avoid a problem that heat exchange efficiency of the condenser 20 is low because when the plugboard 200 is powered on and started, some working substances in the liquid state on the liquid return pipeline 40 flow backward and enters the condenser 20 due to a sudden increase in pressure in the evaporator 10. For example, the working substance balancing apparatus may be a liquid storage tank. The liquid storage tank has a liquid intake end and a liquid exhaust end. The liquid intake end and the liquid exhaust end are connected to the liquid return pipeline, to connect the liquid storage tank and the liquid return pipeline in series. Alternatively, the working substance balancing apparatus may be a liquid accumulation cavity disposed on a first pipe.

Figure 15:
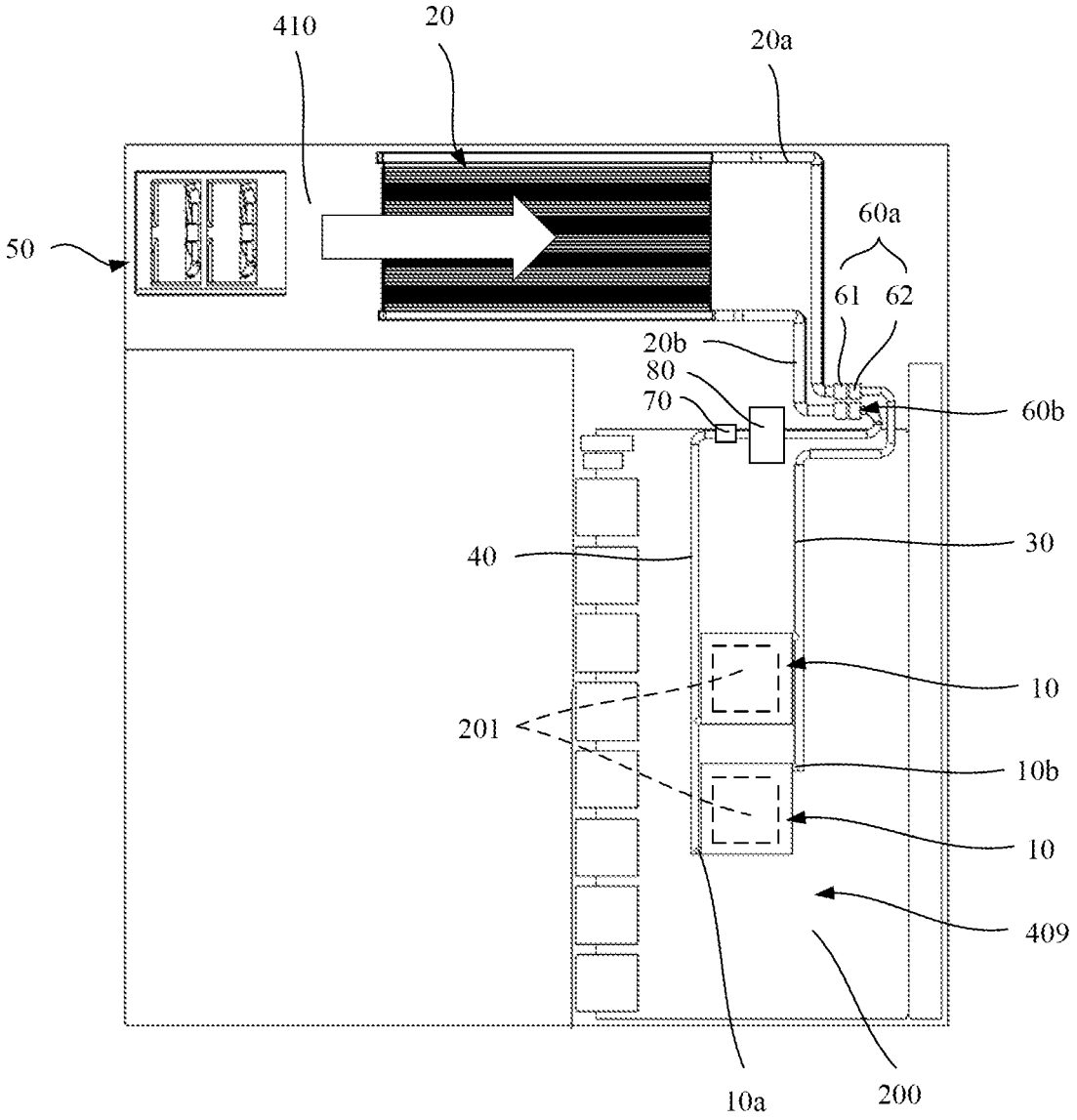
FIG. 15 is a side view of a communications device according to another embodiment of this disclosure.

For example, as shown in FIG. 15, in an extension direction of the liquid return pipeline 40, a working substance balancing apparatus 80 is located on a side that is of the switch valve 70 and that is away from the evaporator 10, to be specific, the working substance balancing apparatus 80 is located between the second fast switching connector 60b of the liquid return pipeline 40 and the switch valve 70. When flowing backward, the working substance on the liquid return pipeline 40 flows into the working substance balancing apparatus 80, to prevent the working substance from flowing backward to enter the condenser 20. In addition, the working substance balancing apparatus 80 may further store excessively large mass of the working substance, to avoid a heat dissipation effect of the entire heat exchange loop from being affected due to excessively large mass of the working substances.

To help show an effect of the working substance balancing apparatus, a plugboard with the working substance balancing apparatus and a plugboard without the working substance balancing apparatus are tested. A supercool degree of the plugboard with the working substance balancing apparatus is optimized by 2° C. to 3° C. compared with that of the plugboard without the working substance balancing apparatus. In addition, in a test of a load of 300 W, a superheat degree of the plugboard with the working substance balancing apparatus is 2.8° C. higher than that of the plugboard without the working substance balancing apparatus.

Referring to FIG. 4 and FIG. 5, an embodiment of this disclosure provides a communications device, including the foregoing heat dissipation cabinet and at least one plugboard 200. Each plugboard 200 is disposed in the first accommodation region 409, and each plugboard 200 has one or more heat source components 201. Each evaporator 10 is in thermal contact with an outer surface of the one or more heat source components 201.

It should be noted that the implementation of the embodiment of the heat dissipation cabinet is also applicable to the embodiment of the communications device, and a same technical effect can be achieved. Details are not described herein again.

In another embodiment of this disclosure, to help rapidly assemble the evaporator and the plugboard into the cabinet body, referring to FIG. 4, each evaporator 10 is fastened to the outer surfaces of the one or more heat source components 201. To be specific, the evaporator 10 and the heat source component 201 are assembled together when the plugboard 200 is manufactured. When the plugboard 200 is assembled, the plugboard 200 with the evaporator 10 on the heat source component 201 is directly assembled into the cabinet body 400, and a heat exchange loop is further formed in combination with another component. In this way, assembly efficiency can be improved, and the evaporator 10 no longer needs to be installed on the heat source component 201 on the spot. In addition, when the plugboard 200 is manufactured, the evaporation pipeline 30 and the liquid return pipeline 40 may further be connected to the evaporator 10. In this case, as independent parts, the plugboard 200 with the heat source component 201 and the evaporator 10 connected to the evaporation pipeline 30 and the liquid return pipeline 40 may be more quickly installed into the cabinet body 400, thereby improving assembly efficiency.

Figure 9A:
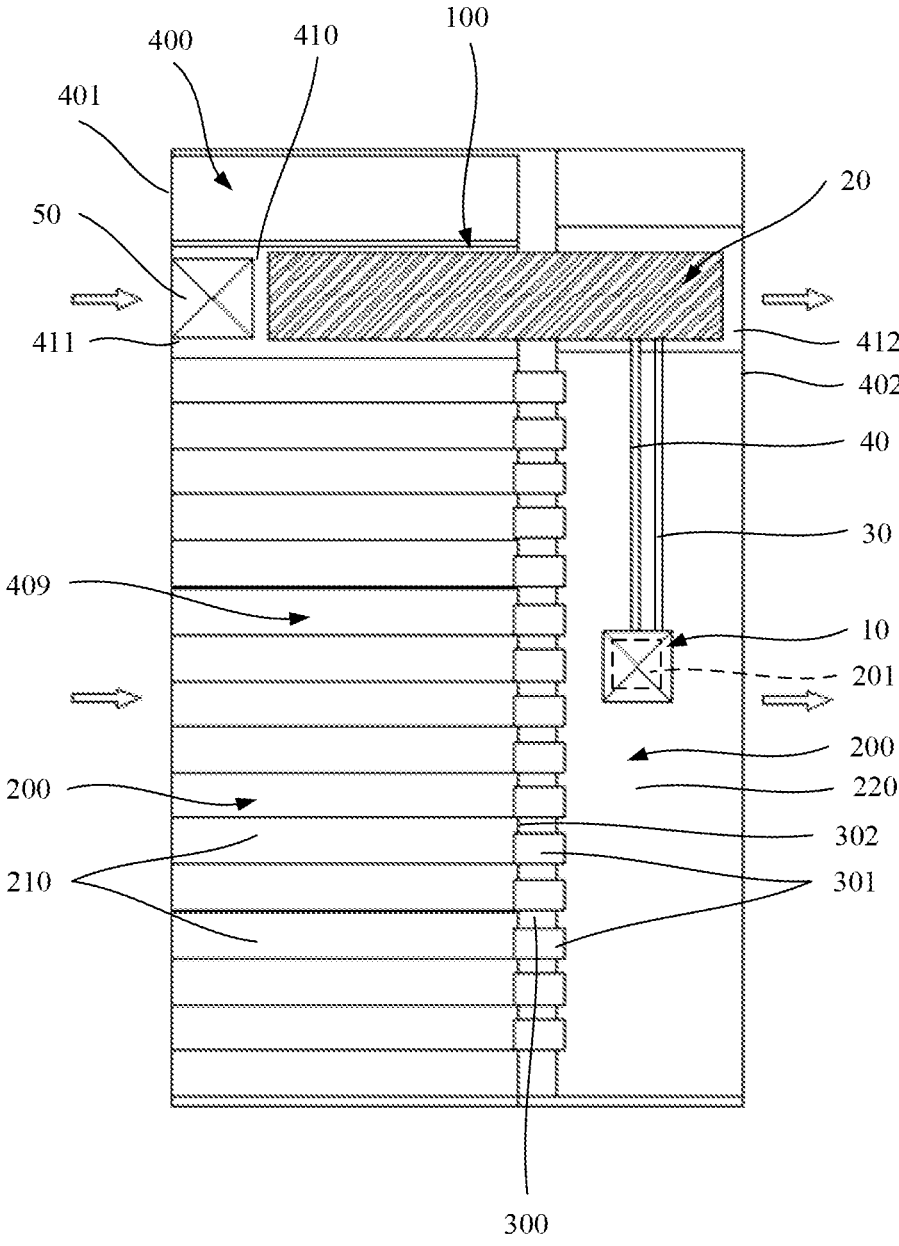
FIG. 9*a* is a side view of a communications device according to another embodiment of this disclosure.
Figure 9B:
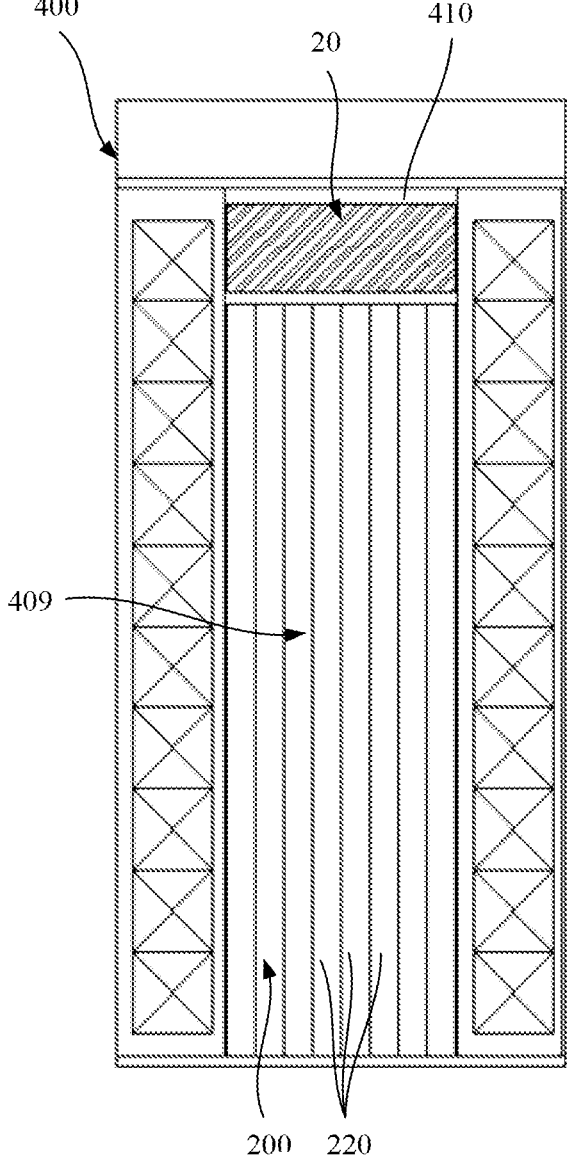
FIG. 9*b* is a back view of the communications device in FIG. 9*a;*

In another embodiment of this disclosure, when the communications device is an orthogonal system with a double-panel plugboard, referring to FIG. 9a and FIG. 9b, the plugboards 200 are classified into a first plugboard 210 and a second plugboard 220. All first plugboards 210 are located at a front end of the cabinet body 400 and stacked along a vertical direction, and all second plugboards 220 are located at a rear end of the cabinet body 400 and stacked along a horizontal direction. All heat source components 201 installed on the first plugboard 210 and the second plugboard 220 in the cabinet body 400 can draw, by using the foregoing heat dissipation apparatus 100, heat generated by the heat source components 201 far to the condenser 20 located in the second accommodation region 410. The condenser 20 is used as a heat dissipation resource pool, and the fan 50 is used to centrally cool the heat dissipation resource pool. In this way, a path of the second accommodation region 410 is relatively short, heat dissipation efficiency is relatively high, and a heat dissipation capability is maximized. An arrow in FIG. 9a is a direction of an air flow generated by the fan 50.

When the first plugboard and the second plugboard are assembled into the cabinet body, referring to FIG. 4, the communications device further includes a back panel 300. The back panel 300 is disposed in the first accommodation region 409 of the cabinet body 400. A first surface of the back panel 300 has a first slot 301, and the first plugboard 210 is pluggably installed in the first slot 301. A second surface of the back panel 300 has a second slot 302, and the second plugboard 220 is pluggably installed in the second slot 302. In this way, the heat dissipation cabinet becomes a pluggable system. The first plugboard 210, the second plugboard 220, and the back panel 300 may be printed circuit boards. When the first plugboard 210 or the second plugboard 220 is plugged into the corresponding slot of the back panel 300, the back panel 300 supplies power to the corresponding plugboard. Because the condenser 20 is removed out of the plugboard 200, in space of a same size in the cabinet body 400, a quantity of slots on the back panel 300 may increase to obtain a competitive advantage of the quantity of slots, and more first plugboards 210 and second plugboards 220 may be arranged to increase a device capacity. The heat source component 201 on the plugboard 200 has a strong heat dissipation capability, so that cool and hot plugging and unplugging can be performed on the plugboard 200 without affecting working of the plugboard 200. This improves reliability and fast maintenance of the system.

For example, with reference to FIG. 9a and FIG. 9b, in the first accommodation region 409 of the cabinet body 400, the first plugboard 210 on a front side of the back panel 300 is arranged along an up-down direction, and the second plugboard 220 on a rear side of the back panel 300 is arranged along a left-right direction. The second accommodation region 410 is located on an upper section of the cabinet body 400, and extends along a front-rear direction of the cabinet body 400. An air inlet 411 is on a front side of the cabinet body 400, and an air outlet 412 is on a rear side of the cabinet body 400. The fan 50 is disposed in a front region of the second accommodation region 410. The condenser 20 is located in the second accommodation region 410. An air exhaust side 51 of the fan 50 is disposed opposite an air exhaust side of the condenser 20. During working, an air flow generated by the fan 50 flows from the front side to the rear side of the cabinet body 400, to blow, out of the cabinet body 400, heat released by the condenser 20, thereby implementing air-cooling heat dissipation. The fans 50 may be arranged in a straight line and disposed at the air inlet 411 of the second accommodation region 410. In this way, a structure is compact, which can provide a sufficient amount of air for the condenser 20.

Figure 10A:
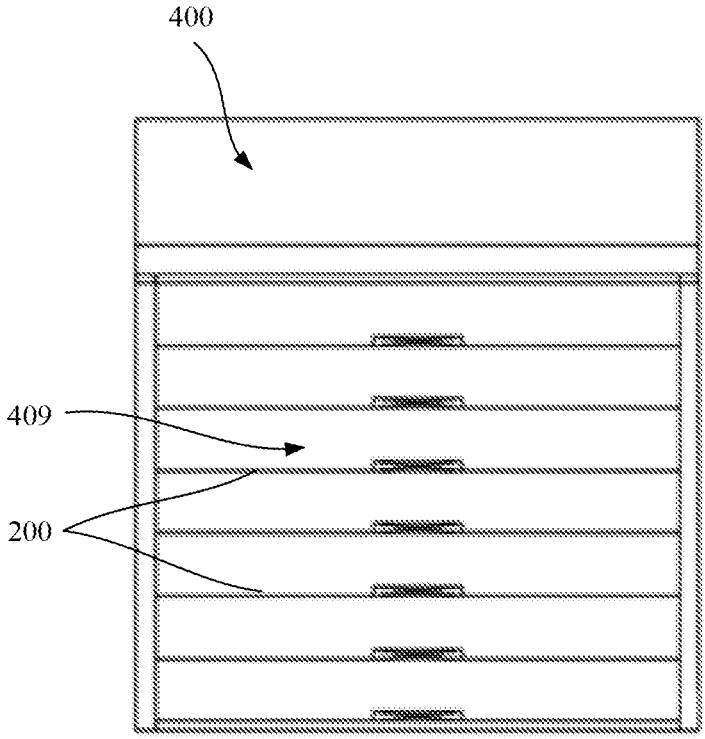
FIG. 10*a* is a front view of a communications device according to another embodiment of this disclosure.
Figure 10B:
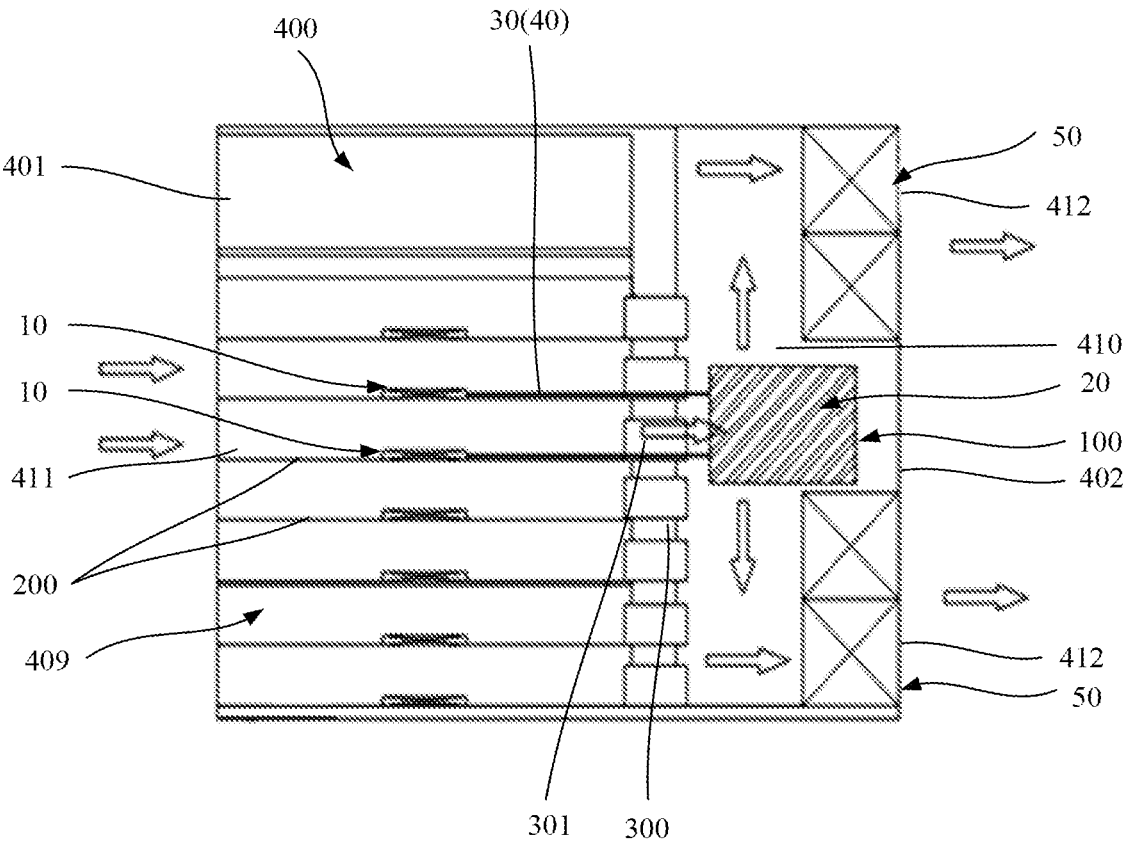
FIG. 10*b* is a side view of the communications device in FIG. 10*a;*

In another embodiment of this disclosure, when the communications device is a system with a single-panel front plugboard, referring to FIG. 10a and FIG. 10b, the plugboards 200 are located at the front end of the cabinet body 400 and stacked along a vertical direction. All heat source components 201 installed on the plugboards 200 in the cabinet body 400 can draw, by using the foregoing heat dissipation apparatus 100, heat generated by the heat source components 201 far to the condenser 20 located in the second accommodation region 410. The condenser 20 is used as a heat dissipation resource pool, and the fan 50 is used to centrally cool the heat dissipation resource pool. In this way, a path of the second accommodation region 410 is relatively short, heat dissipation efficiency is relatively high, and a heat dissipation capability is maximized. An arrow in FIG. 10b is a direction of an air flow generated by the fan 50.

Figure 11:
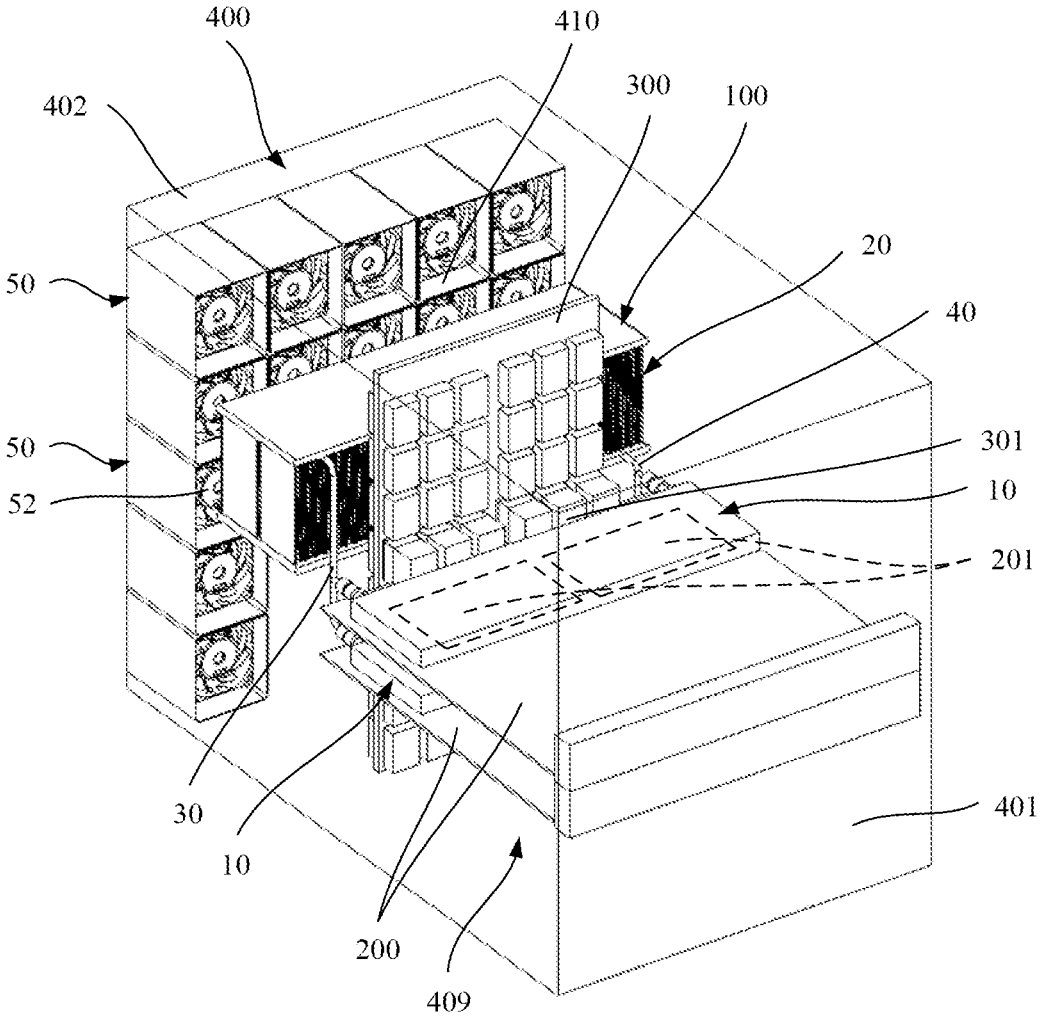
FIG. 11 is a diagram of a three-dimensional structure of a communications device according to another embodiment of this disclosure.

When the plugboard is assembled into the cabinet body, referring to FIG. 11, the communications device further includes a back panel 300. The back panel 300 is disposed in the first accommodation region 409 of the cabinet body 400. A first surface of the back panel 300 has a first slot 301, and the plugboard 200 is pluggably installed in the first slot 301, so that the heat dissipation cabinet becomes a pluggable system. When the plugboard 200 is plugged into the first slot 301 of the back panel 300, the back panel 300 supplies power to the plugboard 200. Because the condenser 20 is removed out of the plugboard 200, in space of a same size in the cabinet body 400, a quantity of slots on the back panel 300 may increase to obtain a competitive advantage of the quantity of slots, and more plugboards 200 may be arranged to increase a device capacity.

For example, with reference to FIG. 10a and FIG. 10b, the first accommodation region 409 is located at a front section of the cabinet body 400, a plurality of plugboards 200 are stacked on a front side of the back panel 300, and no plugboard is disposed on a rear side of the back panel 300. The second accommodation region 410 is located at a position of a rear section close to a top section of the cabinet body 400, that is, the condenser 20 is disposed on the rear side of the back panel 300. A position of the condenser 20 needs to be higher than a position of the evaporator 10. The air inlet 411 is on a front side of the cabinet body 400 or on a front panel of the plugboard 200, and the air outlet 412 is on a rear side of the cabinet body 400. The fan 50 is disposed at the air outlet 412 on the rear side of the cabinet body 400, and an air intake side 52 of the fan 50 faces an air exhaust side of the condenser 20. During working, an air flow generated by the fan 50 flows from the front side to the rear side of the cabinet body 400, to blow, out of the cabinet body 400, heat released by the condenser 20, thereby implementing air-cooling heat dissipation. The fans 50 may be arranged in an array and disposed at the air outlet 412. In this way, a structure is compact, which can provide a sufficient amount of air for the condenser 20.

Generally, the plugboard 200 that undertakes a service function in the entire system requires installation and maintenance through plugging and unplugging. The fast switching connector is disposed on the heat exchange loop, so that the evaporation end of the plugboard 200 and the condenser 20 can be separately plugged and unplugged. This overcomes a disadvantage that the condenser 20 outside the plugboard cannot be integrally plugged and unplugged with the plugboard due to limitations of space and reliability. In addition, the switch valve 70 is disposed on the pipeline at the evaporation end, so that on and off of the switch valve 70 may be controlled to overcome a disadvantage that mass distribution of the working substance in the heat exchange loop greatly changes due to plugging and unplugging of the plugboard in different scenarios.

The heat exchange loop is classified into the evaporation end and the condensation end. There are fast switching connectors on the pipelines at the evaporation end and the condensation end. When a male connector and a female connector in the fast switching connector are connected, the entire heat exchange loop becomes an integrated heat exchange loop through connection and can normally work. When the fast switching connector is disconnected, the entire heat exchange loop is in a split state and is divided into two sections: the evaporation end and the condensation end. The switch valve 70 is disposed in the entire heat exchange loop (for example, the switch valve is disposed on the plugboard in FIG. 14 and FIG. 15). The switch valve 70 is controlled to be turned on and off by powering on or off, or in another manner, for example, whether a temperature reaches a specific threshold. For example, when the cabinet is a powered-on state, and the plugboard 200 is plugged into the cabinet, the fast switching connector is connected to be conductive, to form an integrated heat exchange loop. In addition, a connector of the plugboard 200 is plugged into a connector of a back panel 22 to implement an electrical connection, and the plugboard is powered on. The switch valve 70 in the heat exchange loop is powered on to be conductive, and the heat exchange loop normally works. In this state, the plugboard 200 is unplugged, the fast switching connector is disconnected, the heat exchange loop is in a split state, the connector of the plugboard 200 is synchronously separated from the connector of the back panel 22, and the switch valve 70 in the heat exchange loop is powered off. A distribution state of the working substance in the heat exchange loop is consistent with that in a normal working state during connection and power-on. When the cabinet is in a power-off state, and the plugboard 200 is plugged into the cabinet, the fast switching connector is connected to be conductive to form an integrated heat exchange loop. In addition, the connector of the plugboard 200 is plugged into the connector of the back panel 22 to implement an electrical connection, but the plugboard is not powered on. The switch valve 70 in the heat exchange loop is still in a power-off and disconnected state, and distribution of the working substance in the heat exchange loop is still consistent with that in the disconnected state before the plugboard 200 is plugged, that is, the distribution of the working substance in the heat exchange loop is consistent with that in the normal working state during connection and power-on.

It can be learned from the foregoing description that in this embodiment of this disclosure, the condenser 20 is pulled far beyond a region of the plugboard 200, a heat dissipation area can be effectively enlarged without being limited by space and a layout of the plugboard 200, thereby improving a heat dissipation capability. In addition, a fast-unplugging apparatus is disposed on the pipeline of the heat exchange loop, to resolve a problem of fast connection and disconnection of the pipeline. In this way, the condenser 20 may be disposed beyond the region of the plugboard 200, to avoid a problem that a heat dissipation capability is limited because the condenser 20 is limited by the space and the layout of the plugboard 200. In addition, the space occupied by the plugboard 200 is reduced, thereby increasing layout space of a component in the plugboard. The condenser 20 may be effectively adjusted a size and a heat dissipation area based on power consumption of the chip and a heat dissipation requirement, to achieve a more flexible heat dissipation effect. In addition, when the evaporation end in the plugboard 200 and the condensation end outside the plugboard are separately plugged and unplugged, after the plugboard is replaced through plugging and unplugging at different temperatures, total mass of the working substance in the entire heat exchange loop remains as same as possible, to ensure that cooling and heat dissipation capabilities of the entire heat exchange loop are consistent.

In conclusion, the foregoing descriptions are merely specific implementations of this disclosure, but are not intended to limit the protection scope of this disclosure. Any variation or replacement within the technical scope disclosed in this disclosure shall fall within the protection scope of this disclosure. Therefore, the protection scope of this disclosure shall be subject to the protection scope of the claims.

What is claimed is:

1. A heat dissipation cabinet comprising:

a cabinet body; and at least one heat dissipation apparatus, wherein the cabinet body has a first accommodation region and a second accommodation region;

the first accommodation region is configured to accommodate at least one plugboard with heat source components;

the heat dissipation apparatus comprises at least one evaporator, at least one condenser, an evaporation pipeline a liquid return pipeline and a fan;

the evaporator is configured to be in thermal contact with an outer surface of one or more of the heat source components;

the condenser is disposed in the second accommodation region and is located above the evaporator, in the heat dissipation apparatus;

the evaporator is connected to the condenser through the evaporation pipeline and the liquid return pipeline to form a beat exchange loop;

the fan is configured to dissipate heat of the condenser through air cooling;

in a same heat dissipation apparatus, the evaporator has a first inlet end and a first outlet end, the condenser has a second inlet end and a second outlet end, two ends of the evaporation pipeline are respectively connected to the first outlet end and the second inlet end, and two ends of the liquid return pipeline are respectively connected to the second outlet end and the first inlet end;

the second inlet end of the condenser is detachably connected to the evaporation pipeline via a first switching connector; and the second outlet end of the condenser is detachably connected to the liquid return pipeline via a second switching connector.

2. The heat dissipation cabinet according to claim 1, wherein a switch valve is disposed on at least the liquid return pipeline; or the switch valve is disposed on both the liquid return pipeline and the evaporation pipeline.

3. The heat dissipation cabinet according to claim 2, wherein the switch valve is an electromagnetic control valve; and the heat dissipation cabinet further comprises control circuitry, wherein the control circuitry is configured to control on and off switching of the electromagnetic control valve.

4. The heat dissipating cabinet according to claim 3, wherein the control circuitry includes a control circuit configured to control the electromagnetic control valve to be turned on.

5. The heat dissipation cabinet according to claim 3, wherein the heat dissipation cabinet further comprises a sensor configured to detect a temperature of one or more of the heat source components on the plugboard; and the control circuitry is configured to control the electromagnetic control valve to be turned on when the temperature detected by the sensor exceeds a specified value.

6. The heat dissipation cabinet according to claim 1, wherein a section that is part of the evaporation pipeline and that is configured to connect to the first switching connector is disposed as a flexible pipe; or the evaporation pipeline is a flexible pipe; and a section that is part of the liquid return pipeline and that is configured to connect to the second switching connector is a flexible pipe, or the liquid return pipeline is a flexible pipe.

7. The heat dissipation cabinet according to claim 1, wherein the condenser comprises a plurality of heat exchange pipes and a plurality of heat dissipation fins, at least some of the plurality of heat exchange pipes are disposed in parallel at intervals, a first end of each of the plurality of heat exchange pipes communicates with the second inlet end, and a second end of each of the plurality of heat exchange pipes communicates with the second outlet end, and the heat dissipation fins are connected to the heat exchange pipes.

8. The heat dissipation cabinet according to claim 1, wherein a plurality of heat dissipation apparatuses are disposed, and condensers in two or more heat dissipation apparatuses are disposed adjacent to each other; or there are a plurality of heat dissipation apparatuses, and at least two heat dissipation apparatuses share one condenser.

9. The heat dissipation cabinet according to claim 1, wherein the heat dissipation apparatus further comprises a heat sink fastened to the evaporator.

10. The heat dissipation cabinet according to claim 2, wherein:

the heat exchange loop is filled with a refrigerant;

a balancing apparatus is connected in series to the liquid return pipeline, and is configured to supplement the refrigerant after maintenance of the heat exchange loop.

11. The heat dissipation cabinet according to claim 10, wherein when the switch valve is disposed on the liquid return pipeline, in an extension direction of the liquid return pipeline, the balancing apparatus is located on a side that is part of the switch valve and that is away from the evaporator.

12. A communications device comprising:

the heat dissipation cabinet of claim 1; and the at least one plugboard.

13. The heat dissipation cabinet according to claim 12, wherein:

a switch valve is disposed on at least the liquid return pipeline; or the switch valve is disposed on both the liquid return pipeline and the evaporation pipeline.

14. The communications device according to claim 12, wherein the evaporator is fastened to the outer surface of the one or more heat source components.

15. The communications device according to claim 12, wherein:

the at least one plugboard includes first plugboards and second plugboards, all of the first plugboards are located at a front end of the cabinet body and stacked along a vertical direction, and all of the second plugboards are located at a rear end of the cabinet body and stacked along a horizontal direction; or the at least one plugboard includes a plurality of plugboards and all of the plurality of the plugboards are located at a front end of the cabinet body and stacked along a vertical direction.

16. The communications device according to claim 15, wherein:

the at least one plugboard includes the first plugboards and the second plugboards, the communications device further comprises a back panel, and the back panel is disposed in the first accommodation region of the cabinet body;

a first surface of the back panel has a first slot, and at least one of the first plugboards is pluggably installed in the first slot; and a second surface of the back panel has a second slot, and at least one of the second plugboards is pluggably installed in the second slot.

* * * * *